(12) United States Patent
Bibl et al.

(10) Patent No.: US 10,573,629 B2
(45) Date of Patent: *Feb. 25, 2020

(54) METHOD FOR INTEGRATING A LIGHT EMITTING DEVICE

(71) Applicant: Apple Inc., Cupertino, CA (US)

(72) Inventors: Andreas Bibl, Los Altos, CA (US); Charles R. Griggs, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,125

(22) Filed: Feb. 25, 2019

(65) Prior Publication Data

US 2019/0259739 A1    Aug. 22, 2019

Related U.S. Application Data

(63) Continuation of application No. 15/850,862, filed on Dec. 21, 2017, now Pat. No. 10,256,221, which is a
(Continued)

(51) Int. Cl.
*H01L 25/16* (2006.01)
*H01L 33/44* (2010.01)
(Continued)

(52) U.S. Cl.
CPC ............ *H01L 25/167* (2013.01); *H01L 24/95* (2013.01); *H01L 25/0753* (2013.01);
(Continued)

(58) Field of Classification Search
None
See application file for complete search history.

(56) References Cited

U.S. PATENT DOCUMENTS 5,442,254 A    8/1995 Jaskie
5,592,358 A    1/1997 Shamouilian et al.
(Continued)

FOREIGN PATENT DOCUMENTS

EP    1780798 A1    5/2007
JP    H5-47856 A    2/1993
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — J. E. Schoenholtz
(74) *Attorney, Agent, or Firm* — Jaffery Watson Mendonsa & Hamilton LLP

(57) ABSTRACT

Light emitting devices and methods of integrating micro LED devices into light emitting device are described. In an embodiment a light emitting device includes a reflective bank structure within a bank layer, and a conductive line atop the bank layer and elevated above the reflective bank structure. A micro LED device is within the reflective bank structure and a passivation layer is over the bank layer and laterally around the micro LED device within the reflective bank structure. A portion of the micro LED device and a conductive line atop the bank layer protrude above a top surface of the passivation layer.

18 Claims, 29 Drawing Sheets

Related U.S. Application Data continuation of application No. 15/405,060, filed on Jan. 12, 2017, now Pat. No. 9,876,000, which is a continuation of application No. 14/976,541, filed on Dec. 21, 2015, now Pat. No. 9,570,427, which is a continuation of application No. 14/603,960, filed on Jan. 23, 2015, now Pat. No. 9,240,397, which is a continuation of application No. 13/919,965, filed on Jun. 17, 2013, now Pat. No. 8,987,765.

(51) Int. Cl.
| | |
|---|---|
| *H01L 33/08* | (2010.01) |
| *H01L 33/52* | (2010.01) |
| *H01L 33/60* | (2010.01) |
| *H01L 27/02* | (2006.01) |
| *H01L 23/00* | (2006.01) |
| *H01L 25/075* | (2006.01) |
| *H01L 27/12* | (2006.01) |
| *H01L 33/20* | (2010.01) |
| *H01L 33/48* | (2010.01) |
| *H01L 33/06* | (2010.01) |
| *H01L 33/30* | (2010.01) |
| *H01L 33/62* | (2010.01) |
| *H01L 33/00* | (2010.01) |
| *H01L 33/54* | (2010.01) |
| *H01L 33/56* | (2010.01) |

(52) U.S. Cl.
CPC ........ *H01L 25/165* (2013.01); *H01L 27/0203* (2013.01); *H01L 27/124* (2013.01); *H01L 27/1244* (2013.01); *H01L 33/0008* (2013.01); *H01L 33/06* (2013.01); *H01L 33/08* (2013.01); *H01L 33/20* (2013.01); *H01L 33/30* (2013.01); *H01L 33/44* (2013.01); *H01L 33/486* (2013.01); *H01L 33/52* (2013.01); *H01L 33/54* (2013.01); *H01L 33/56* (2013.01); *H01L 33/60* (2013.01); *H01L 33/62* (2013.01); *H01L 2924/0002* (2013.01); *H01L 2924/12041* (2013.01); *H01L 2924/12042* (2013.01); *H01L 2924/12044* (2013.01); *H01L 2933/005* (2013.01); *H01L 2933/0025* (2013.01); *H01L 2933/0033* (2013.01); *H01L 2933/0066* (2013.01)

(56) References Cited

U.S. PATENT DOCUMENTS

| | | | |
|---|---|---|---|
| 5,839,187 A | 11/1998 | Sato et al. | |
| 5,851,664 A | 12/1998 | Bennett et al. | |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,335,263 B1 | 1/2002 | Cheung et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,786,390 B2 | 9/2004 | Yang et al. | |
| 6,878,607 B2 | 4/2005 | Inoue et al. | |
| 7,033,842 B2 | 4/2006 | Haji et al. | |
| 7,148,127 B2 | 12/2006 | Oohata et al. | |
| 7,208,337 B2 | 4/2007 | Eisert et al. | |
| 7,353,596 B2 | 4/2008 | Shida et al. | |
| 7,358,158 B2 | 4/2008 | Aihara et al. | |
| 7,399,429 B2 | 7/2008 | Liu et al. | |
| 7,482,059 B2 | 1/2009 | Peng et al. | |
| 7,482,696 B2 | 1/2009 | Shei | |
| 7,585,703 B2 | 9/2009 | Matsumura et al. | |
| 7,723,764 B2 | 5/2010 | Oohata et al. | |
| 7,795,629 B2 | 9/2010 | Watanabe et al. | |
| 7,797,820 B2 | 9/2010 | Shida et al. | |
| 7,838,410 B2 | 11/2010 | Hirao et al. | |
| 7,854,365 B2 | 12/2010 | Li et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 | 7/2011 | Rogers et al. | |
| 7,989,266 B2 | 8/2011 | Borthakur et al. | |
| 7,999,454 B2 | 8/2011 | Winters et al. | |
| 8,023,248 B2 | 9/2011 | Yonekura et al. | |
| 8,264,777 B2 | 9/2012 | Skipor et al. | |
| 8,294,168 B2 | 10/2012 | Park et al. | |
| 8,329,485 B2 | 12/2012 | McKean | |
| 8,333,860 B1 | 12/2012 | Bibl et al. | |
| 8,349,116 B1 | 1/2013 | Bibl et al. | |
| 8,415,767 B1 | 4/2013 | Golda et al. | |
| 8,415,768 B1 | 4/2013 | Golda et al. | |
| 8,415,771 B1 | 4/2013 | Golda et al. | |
| 8,426,227 B1 | 4/2013 | Bibl et al. | |
| 8,497,143 B2 | 7/2013 | Han | |
| 8,497,512 B2 | 7/2013 | Nakamura et al. | |
| 8,987,765 B2 | 3/2015 | Bibl et al. | |
| 9,029,880 B2 | 5/2015 | Sakariya et al. | |
| 9,214,494 B2 | 12/2015 | Sakariya et al. | |
| 9,240,397 B2 | 1/2016 | Bibl et al. | |
| 9,559,142 B2 | 1/2017 | Sakariya et al. | |
| 9,570,427 B2 | 2/2017 | Bibl | |
| 9,876,000 B2 | 1/2018 | Bibl | |
| 10,256,221 B2* | 4/2019 | Bibl | H01L 33/44 |
| 2001/0029088 A1 | 10/2001 | Odajima et al. | |
| 2002/0076848 A1 | 6/2002 | Spooner et al. | |
| 2003/0010975 A1 | 1/2003 | Gibb et al. | |
| 2003/0015721 A1 | 1/2003 | Slater, Jr. et al. | |
| 2003/0177633 A1 | 9/2003 | Haji et al. | |
| 2004/0232439 A1 | 11/2004 | Gibb et al. | |
| 2005/0232728 A1 | 10/2005 | Rice et al. | |
| 2006/0065905 A1 | 3/2006 | Eisert et al. | |
| 2006/0157721 A1 | 7/2006 | Tran et al. | |
| 2006/0160276 A1 | 7/2006 | Brown et al. | |
| 2006/0169993 A1 | 8/2006 | Fan et al. | |
| 2006/0214299 A1 | 9/2006 | Fairchild et al. | |
| 2007/0048902 A1 | 3/2007 | Hiatt et al. | |
| 2007/0111324 A1 | 5/2007 | Nie et al. | |
| 2007/0166851 A1 | 7/2007 | Tran et al. | |
| 2007/0194330 A1 | 8/2007 | Ibbetson et al. | |
| 2008/0142817 A1 | 6/2008 | Ibbetson et al. | |
| 2008/0163481 A1 | 7/2008 | Shida et al. | |
| 2008/0194054 A1 | 8/2008 | Lin et al. | |
| 2008/0196237 A1 | 8/2008 | Shinya et al. | |
| 2008/0283190 A1 | 11/2008 | Papworth et al. | |
| 2008/0303038 A1 | 12/2008 | Grotsch et al. | |
| 2009/0068774 A1 | 3/2009 | Slater et al. | |
| 2009/0146303 A1 | 6/2009 | Kwon | |
| 2009/0303713 A1 | 12/2009 | Chang et al. | |
| 2009/0314991 A1 | 12/2009 | Cho et al. | |
| 2010/0105172 A1 | 4/2010 | Li et al. | |
| 2010/0188794 A1 | 7/2010 | Park et al. | |
| 2010/0203659 A1 | 8/2010 | Akaike et al. | |
| 2010/0203661 A1 | 8/2010 | Hodota | |
| 2010/0248484 A1 | 9/2010 | Bower et al. | |
| 2010/0276726 A1 | 11/2010 | Cho et al. | |
| 2011/0003410 A1 | 1/2011 | Tsay et al. | |
| 2011/0049540 A1 | 3/2011 | Wang et al. | |
| 2011/0151602 A1 | 6/2011 | Speier | |
| 2011/0159615 A1 | 6/2011 | Lai | |
| 2011/0210357 A1 | 9/2011 | Kaiser et al. | |
| 2011/0284867 A1 | 11/2011 | Tran et al. | |
| 2011/0299044 A1 | 12/2011 | Yeh et al. | |
| 2012/0018746 A1 | 1/2012 | Hsieh | |
| 2012/0032573 A1 | 2/2012 | Lai | |

(56) References Cited

U.S. PATENT DOCUMENTS

| | | | |
|---|---|---|---|
| 2012/0064642 | A1 | 3/2012 | Huang et al. |
| 2012/0134065 | A1 | 5/2012 | Furuya et al. |
| 2012/0161113 | A1 | 6/2012 | Lowenthal et al. |
| 2012/0168776 | A1 | 7/2012 | Nakamura et al. |
| 2012/0250320 | A1 | 10/2012 | Harbers et al. |
| 2012/0286208 | A1 | 11/2012 | McKean et al. |
| 2012/0326188 | A1 | 12/2012 | Han |
| 2013/0056867 | A1 | 3/2013 | Pagaila et al. |
| 2013/0126081 | A1 | 5/2013 | Hu et al. |
| 2013/0187179 | A1 | 7/2013 | Tan et al. |
| 2013/0210194 | A1 | 8/2013 | Bibl et al. |
| 2013/0285086 | A1 | 10/2013 | Hu et al. |
| 2014/0084482 | A1 | 3/2014 | Hu et al. |
| 2014/0159043 | A1 | 6/2014 | Sakariya et al. |
| 2014/0159064 | A1 | 6/2014 | Sakariya et al. |
| 2014/0346537 | A1 | 11/2014 | Xi |
| 2015/0179703 | A1 | 6/2015 | Sakariya et al. |
| 2016/0056204 | A1 | 2/2016 | Sakariya et al. |
| 2018/0182746 | A1 | 6/2018 | Bibl et al. |

FOREIGN PATENT DOCUMENTS

| | | |
|---|---|---|
| JP | 07-060675 A | 3/1995 |
| JP | H10-223832 A | 8/1998 |
| JP | 3406207 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2006-140398 A | 6/2006 |
| JP | 2006-179862 A | 7/2006 |
| JP | 2008-200821 A | 9/2008 |
| JP | 2010-056458 A | 3/2010 |
| JP | 2010-186829 A | 8/2010 |
| JP | 2013-37138 A | 2/2013 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2010/149027 A1 | 12/2010 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID Oct. 8-12, 2006, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Griffin, C., et al, "Micro-pixellated flip-chip InGaN and AlInGaN light-emitting diodes," Optical Society of America, 2007, 2 pgs.

Patel, Prachi, "Quantum Dots Are Behind New Displays," IEEE Spectrum, accessed at http://spectrum.ieee.org/consumer-electronics/audiovideo/quantum-dots-are-behind-new-displays, Jun. 13, 2012, updated Jul. 17, 2012, 3 pgs.

Pickett, et al., "Matters—Commercial volumes of quantum dots: controlled nanoscale synthesis and micron-scale applications," Nanoco Group PLC, accessed at http://www.nanocotechnologies.com/content/Library/NewsandEvents/articles/Material_Matters__Commercial_volumes_of_quantum_dots__controlled_nanoscale_synthesis_and_micronscale_applications/45.aspx, Dec. 13, 2007, 6 pgs.

PCT International Search Report and Written Opinion for International Application No. PCT/US2014/041491, dated Sep. 18, 2014, 10 pages.

PCT International Preliminary Report on Patentability for International Application No. PCT/US2014/041491, dated Dec. 30, 2015, 7 pages.

* cited by examiner

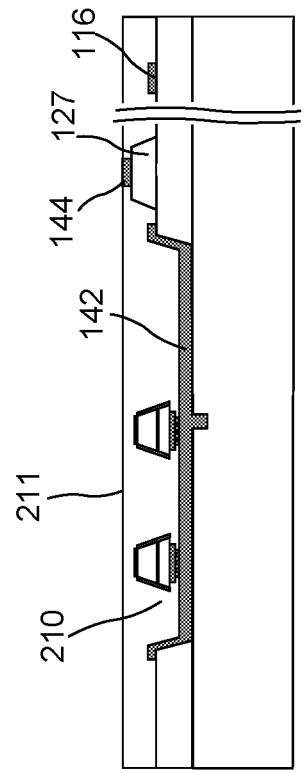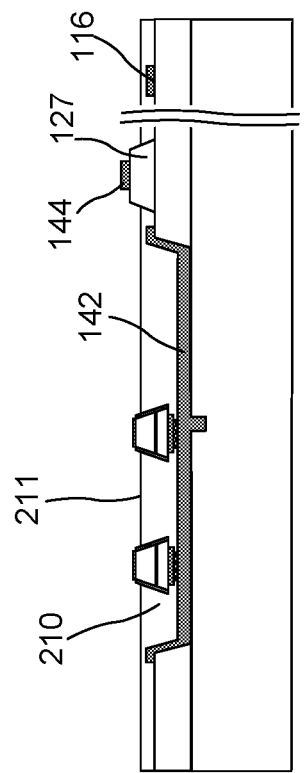
FIG. 7A
FIG. 7B
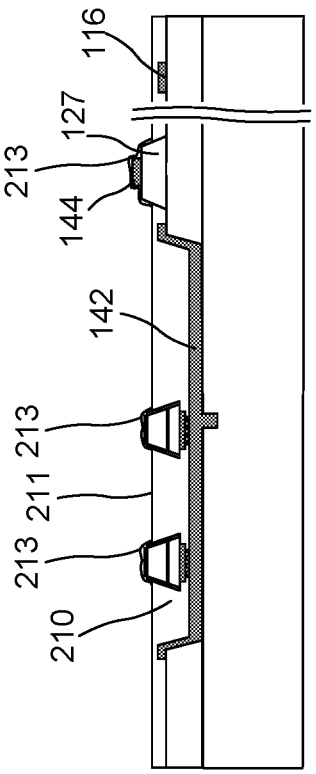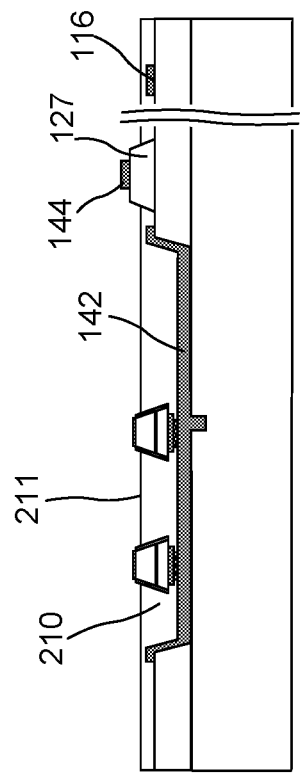
FIG. 8A
FIG. 8B

METHOD FOR INTEGRATING A LIGHT EMITTING DEVICE

RELATED APPLICATION(S)

This application is a continuation application of co-pending U.S. patent application Ser. No. 15/850,862, filed on Dec. 21, 2017, which is a continuation of U.S. patent application Ser. No. 15/405,060, filed Jan. 12, 2017, now U.S. Pat. No. 9,876,000 which is a continuation of U.S. patent application Ser. No. 14/976,541, filed Dec. 21, 2015, now U.S. Pat. No. 9,570,427 which is a continuation of U.S. patent application Ser. No. 14/603,960, filed Jan. 23, 2015, now U.S. Pat. No. 9,240,397 which is a continuation of U.S. patent application Ser. No. 13/919,965, filed on Jun. 17, 2013, now U.S. Pat. No. 8,987,765, which is incorporated herein by reference.

BACKGROUND

Field

The present invention relates to light emitting devices. More particularly embodiments of the present invention relate to methods and structures for integrating micro LED devices into a light emitting device.

Background Information

As light emitting diode (LED) technology continues to advance, semiconductor-based LEDs are increasingly found in lighting and display applications. For example, semiconductor-based LEDs are found in large area outdoor displays, indoor and outdoor lighting, and backlight units in liquid crystal display (LCD) display systems. In order to control the direction of light emission, LED package structures may include an LED chip mounted within a reflective cavity.

In one implementation described in U.S. Pat. No. 7,482,696 an LED chip is flip chip bonded to pads on conductive-reflective films within a cavity. In another implementation described in European Publication No. EP 1780798 A1 an LED chip is mounted within a cavity including a reflector. A filler material is then applied over the LED chip and reflector to protect the LED chip and reflector against moisture and contaminants.

SUMMARY OF THE INVENTION

Light emitting devices and methods of integrating micro LED devices into light emitting device are described. In an embodiment a light emitting device includes a reflective bank structure within a bank layer, and a conductive line atop the bank layer and elevated above the reflective bank structure. A micro LED device is within the reflective bank structure and a passivation layer is over the bank layer and laterally around the micro LED device within the reflective bank structure. A portion of the micro LED device and the conductive line atop the bank layer protrude above a top surface of the passivation layer. The passivation layer may include a substantially flat top surface across the entire area that the passivation layer covers. The passivation layer may be formed of a variety of materials, such as a thermoset material, for example acrylic. The bank layer may be formed over a thin film transistor substrate in an embodiment. For example, the light emitting device may be a display panel in a display system. The light emitting device may also be a light source in a lighting system. A plurality of reflective bank structures can be formed in the bank layer, and a corresponding plurality of micro LED devices can be within the plurality of reflective bank structures. In this configuration, the passivation layer is over the bank layer and laterally around the corresponding plurality of micro LED devices within the plurality of reflective bank structures, and a portion of each micro LED device and the conductive line atop the bank layer protrude from the top surface of the passivation layer.

In an embodiment, a method of integrating a light emitting device includes picking up a micro LED device from a carrier substrate with a transfer head, placing the micro LED device within a reflective bank structure formed in a bank layer, and releasing the micro LED device from the transfer head. A passivation layer is then applied over the bank layer and laterally around the micro LED device within the reflective bank structure. A conductive line atop the bank layer is elevated above the reflective bank structure. The passivation layer is hardened, for example, by UV curing. The passivation layer is etched so that a top surface of the micro LED device and a top surface of the conductive line are not covered by the passivation layer, and a portion of the micro LED device and the conductive line protrude above a top surface of the passivation layer after etching the passivation layer. In an embodiment, the portion of the micro LED device and the conductive line protrude above a top surface of the passivation layer prior to etching the passivation layer, and residues of the passivation layer cover a top surface of the micro LED device or conductive line prior to etching. In an embodiment, etching the passivation layer removes the residues. In some embodiments, the passivation layer is leveled after or while applying the passivation layer to provide a substantially flat top surface of the passivation layer across the entire area that the passivation layer covers. Leveling can be accomplished by a variety of methods including passing a roller, squeegee, or blade across the passivation layer. In an embodiment, applying the passivation layer includes slit coating or roller coating.

A plurality of micro LED devices can be picked up from the carrier substrate with an array of transfer heads, placed within a corresponding plurality of reflective bank structures formed in the bank layer, and released from the transfer heads. The passivation layer can be applied over the bank layer and laterally around the plurality of micro LED devices within the plurality of reflective bank structures. The passivation layer can then be etched such that a top surface of each micro LED device and the top surface of the conductive line are not covered by the passivation layer, and a portion of each micro LED device and the conductive line protrude above the top surface of the passivation layer after etching the passivation layer.

In an embodiment, a method of integrating a light emitting device includes applying a passivation layer over a bank layer and a reflective bank structure within the bank layer, where a conductive line atop the bank layer is elevated above the reflective bank structure. A micro LED device is picked up from a carrier substrate with a transfer head, placed within the reflective bank structure by punching the micro LED device through the passivation layer, and released from the transfer head. The passivation layer is hardened, for example by UV curing. The passivation layer is etched so that a top surface of the micro LED device and a top surface of the conductive line are not covered by the passivation layer, and a portion of the micro LED device and the conductive line protrude above the top surface of the passivation layer after etching the passivation layer. In an embodiment, the portion of the micro LED device and the conductive line protrude above the top surface of the passivation layer prior to etching the passivation layer, and residues of the passivation layer cover the top surface of the micro LED device or conductive line prior to etching. In an embodiment, etching the passivation layer removes the residues. In some embodiments, the passivation layer is leveled after or while applying the passivation layer to provide a substantially flat top surface of the passivation layer across the entire area that the passivation layer covers. Leveling can be accomplished by a variety of methods including passing a roller, squeegee, or blade across the passivation layer. In an embodiment, applying the passivation layer includes slit coating or roller coating.

BRIEF DESCRIPTION OF THE DRAWINGS

FIGS. 7A-7B are side-view illustrations of etching passivation layer residues from the micro LED devices and conductive line atop a bank layer in accordance with an embodiment of the invention.

FIGS. 8A-8B are side-view illustrations of etching a passivation layer so that a portion of the micro LED devices and a conductive line atop a bank layer protrude above a top surface of the passivation layer in accordance with an embodiment of the invention.

DETAILED DESCRIPTION OF THE INVENTION

Figure 1A:
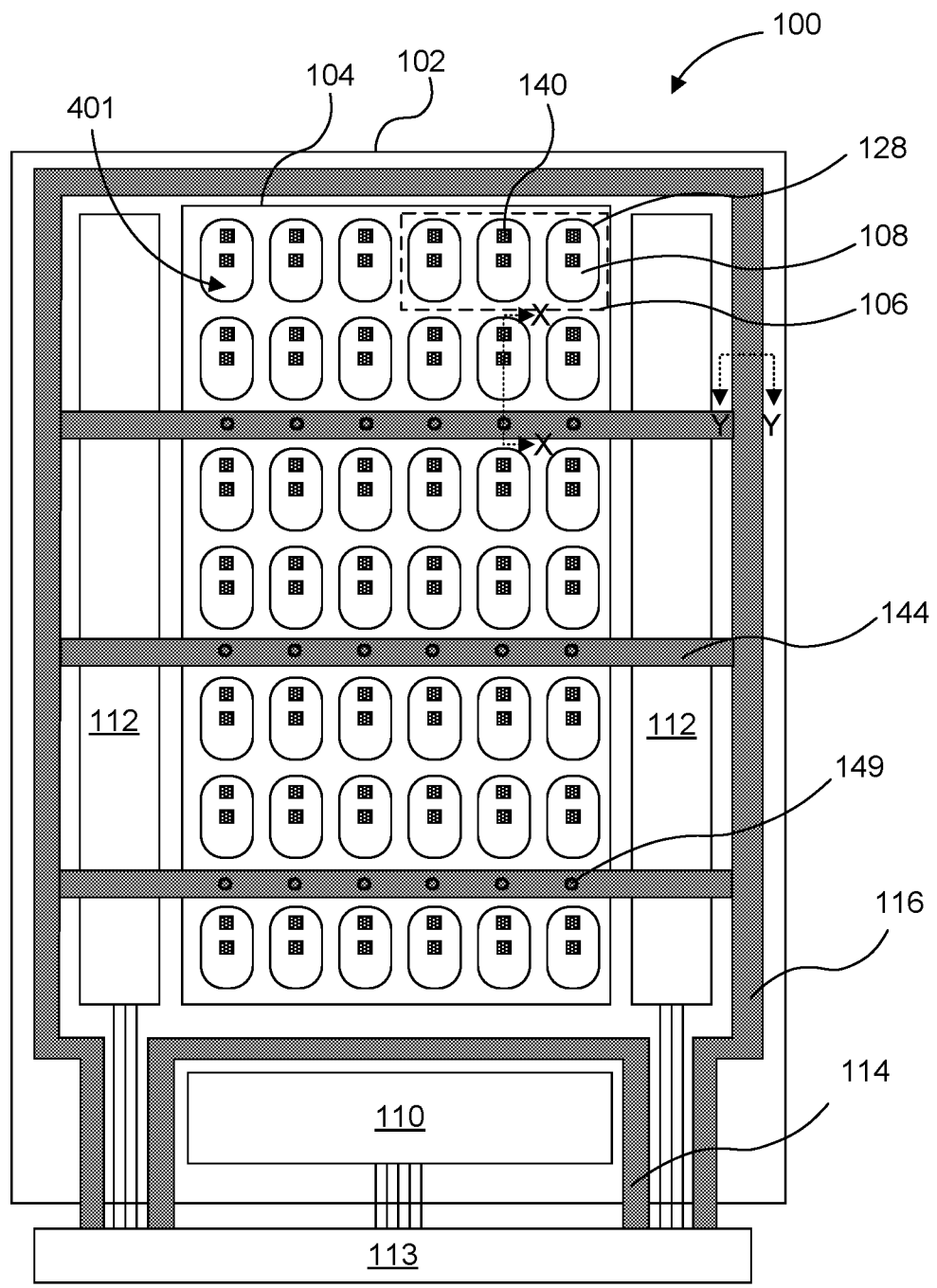
FIG. 1A is a top view illustration of an active matrix display panel in accordance with an embodiment of the invention.

Embodiments of the present invention describe structures and methods of integrating a plurality of micro LED devices into a corresponding plurality of reflective bank structures of a light emitting device. In some embodiments, the micro LED devices are vertical micro LED devices. A plurality of reflective bank structures are formed within a bank layer and a corresponding plurality of micro LED devices are mounted within the plurality of reflective bank structures. A passivation layer is laterally around the plurality of micro LED devices within the corresponding plurality of reflective bank structures such that a portion of each of the micro LED devices and a conductive line atop the bank layer protrude above a top surface of the passivation layer. The conductive line may be elevated above the reflective bank structures as part of a dam structure. The passivation layer may electrically insulate bottom electrodes or reflective bank structures connected to the micro LED devices from one or more top electrode layers connected to the micro LED devices. The passivation layer may additionally electrically insulate sidewalls of the vertical micro LED devices containing one or more quantum well layers from the top or bottom electrode layers. The passivation layer may be formed over the reflective bank structures and laterally around micro LED devices after mounting the micro LED devices within the reflective bank structures, or alternatively the passivation layer may be formed over the reflective bank structures followed by punching the micro LED devices through the passivation layer to mount the micro LED devices within the reflective bank structures. Following the transfer of the micro LED devices and application of the passivation layer, the passivation layer can be etched to ensure the micro LED devices and one or more conductive lines are not covered by the passivation layer. In some embodiments the micro LED devices and one or more conductive lines protrude above a top surface of the passivation layer prior to and after etching. In such embodiments, etching may be used to ensure any passivation layer residues are removed from a top surface of the micro LED devices and one or more conductive lines. In other embodiments etching reduces the thickness so that the micro LED devices and one or more conductive lines protrude above a top surface of the passivation layer after etching. One or more top electrode layers can then be formed to electrically connect the portions of the micro LED devices protruding above the top surface of the passivation layer to one or more conductive lines protruding above the top surface of the passivation layer.

In one aspect, the integration structures and methods include one or more passivation layer dam structures in which the conductive lines are raised above the reflective bank structures and the passivation layer that is formed. The dam structures may be formed of a variety of materials such as an insulating material used to form the bank layer, or alternatively the dam structures can be the conductive lines themselves. In this manner, the passivation layer can be applied over the reflective bank structure and the conductive lines, and leveled so that the micro LED devices and the conductive lines protrude above the top surface of the passivation layer.

In another aspect, the one or more dam structures may also function as a leveling reference for setting the reference height of the top surface of the passivation layer. In this manner, a leveler such as a roller, squeegee, or blade can follow an applicator of the passivation layer material. The elevation of the top surface of the passivation layer can be adjusted based upon a detected elevation of the dam structures so that a portion of the micro LED devices and conductive lines protrude above a top surface of the passivation layer.

In these manners, the integration structures and methods in accordance with embodiments of the invention may allow for the passivation and electrical connection of the micro LED devices with a reduced number of deposition and patterning techniques.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 μm. For example, each micro LED device may have a maximum width of 1 to 100 μm, with smaller micro LED devices consuming less power. In some embodiments, the micro LED devices may have a maximum width of 20 μm, 10 μm, or 5 μm. In some embodiments, the micro LED devices have a maximum height of less than 20 μm, 10 μm, or 5 μm. The incorporation of micro LED devices in accordance with embodiments of the invention can be used to combine the performance, efficiency, and reliability of wafer-based LED devices with the high yield, low cost, mixed materials of thin film electronics, for both lighting and display applications. Exemplary micro LED devices which may be utilized with some embodiments of the invention are described in U.S. Pat. No. 8,426,227, U.S. Publication No. 2013/0126081, U.S. patent application Ser. No. 13/458,932, U.S. patent application Ser. No. 13/711,554, and U.S. patent application Ser. No. 13/749,647. The light emitting devices in accordance with embodiments of the invention may be highly efficient at light emission and consume very little power (e.g., 250 mW for a 10 inch diagonal display compared to 5-10 watts for a 10 inch diagonal LCD or OLED display), enabling reduction of power consumption of an exemplary display or lighting application incorporating the micro LED devices.

The terms "spanning", "over", "to", "between" and "on" as used herein may refer to a relative position of one layer with respect to other layers. One layer "spanning", "over" or "on" another layer or bonded "to" or in "contact" with another layer may be directly in contact with the other layer or may have one or more intervening layers. One layer "between" layers may be directly in contact with the layers or may have one or more intervening layers.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

Referring now to FIGS. 1A-1D schematic top and side-view illustrations are provided of an active matrix display panel 100 in accordance with embodiments of the invention. In such embodiments, the underlying TFT substrate 102 can be similar to those in a typical AMOLED backplane including working circuitry (e.g. T1, T2). Referring to FIG. 1A, panel 100 may generally include a pixel area 104 including pixels 106 and subpixels 108 arranged in a matrix, and working circuitry connected to each subpixel for driving and switching the subpixels. The non-pixel area generally includes a data driver circuit 110 connected to a data line of each subpixel to enable data signals (Vdata) to be transmitted to the subpixels, a scan driver circuit 112 connected to scan lines of the subpixels to enable scan signals (Vscan) to be transmitted to the subpixels, a power supply line 114 to transmit a power signal (Vdd) to the TFTs, and a ground ring 116 to transmit a ground signal (Vss) to the array of subpixels. As shown, the data driver circuit, scan driver circuit, power supply line, and ground ring are all connected to a flexible circuit board (FCB) 113 which includes a power source for supplying power to the power supply line 114 and a power source ground line electrically connected to the ground ring 116. In accordance with embodiments of the invention, each of the subpixels 108 may be individually addressed with the corresponding underlying TFT circuitry while a uniform ground signal is supplied to the top of the pixel area 104.

Figure 1B:
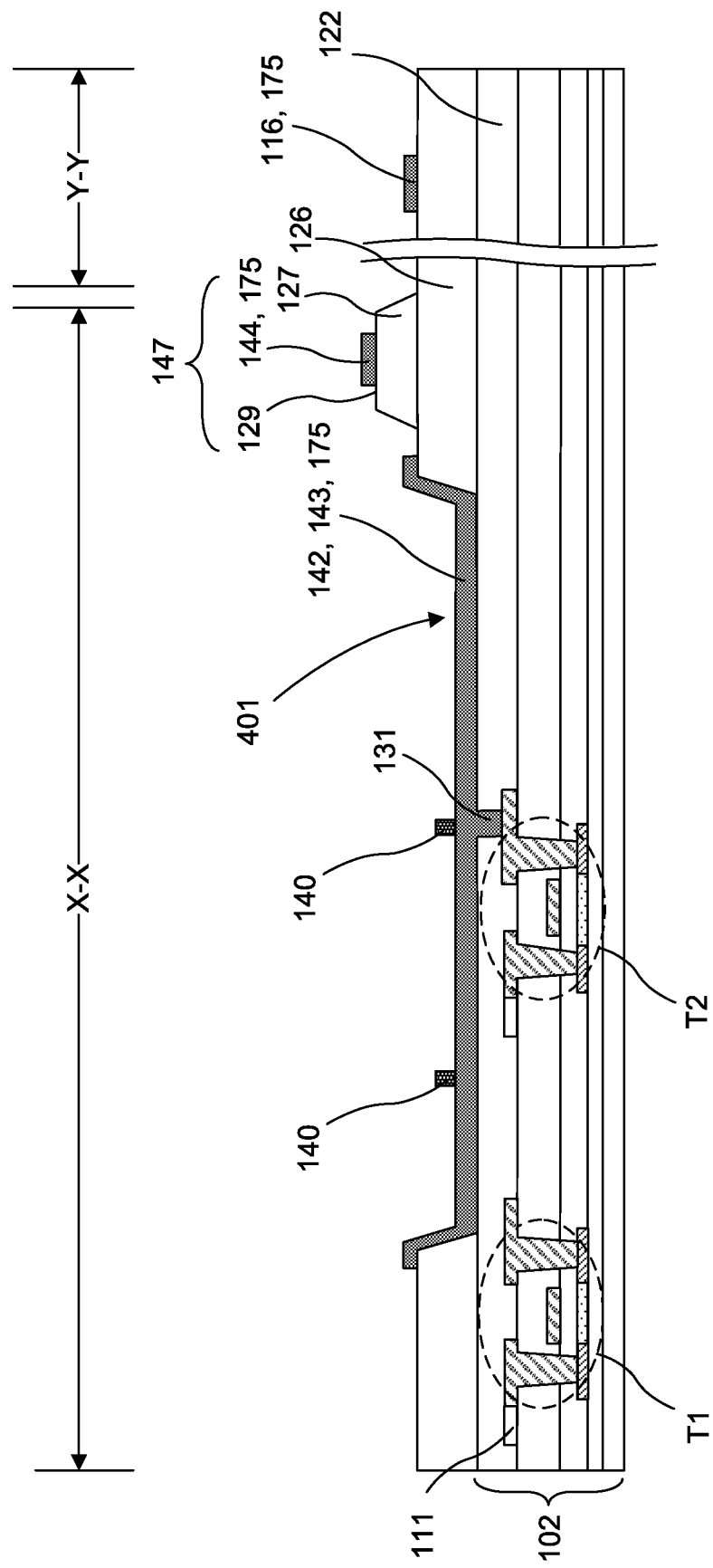
FIG. 1B is a side-view illustration of the active matrix display panel of FIG. 1A taken along lines X-X and Y-Y in accordance with an embodiment of the invention.
Figure 1C:
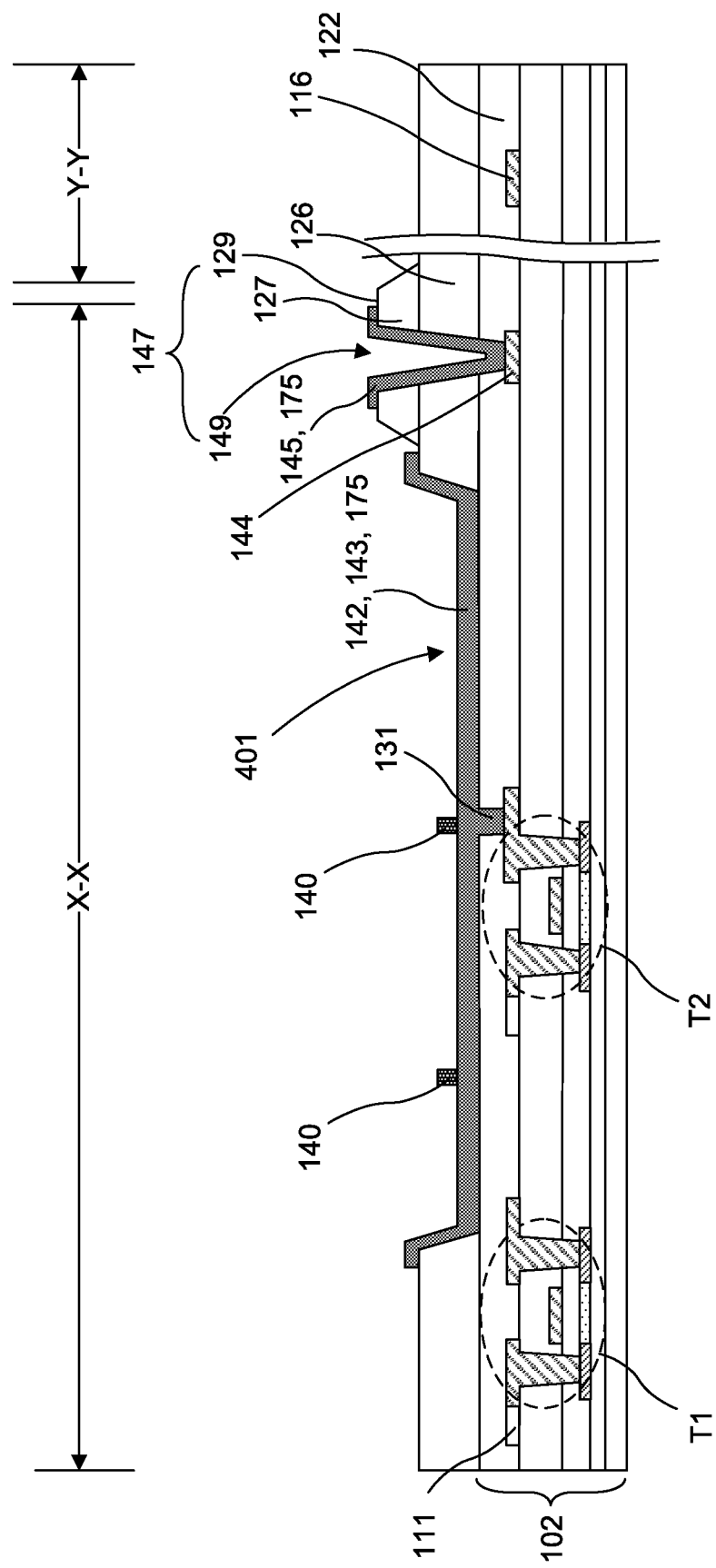
FIG. 1C is a side-view illustration of the active matrix display panel of FIG. 1A taken along lines X-X and Y-Y in accordance with an embodiment of the invention.
Figure 1D:
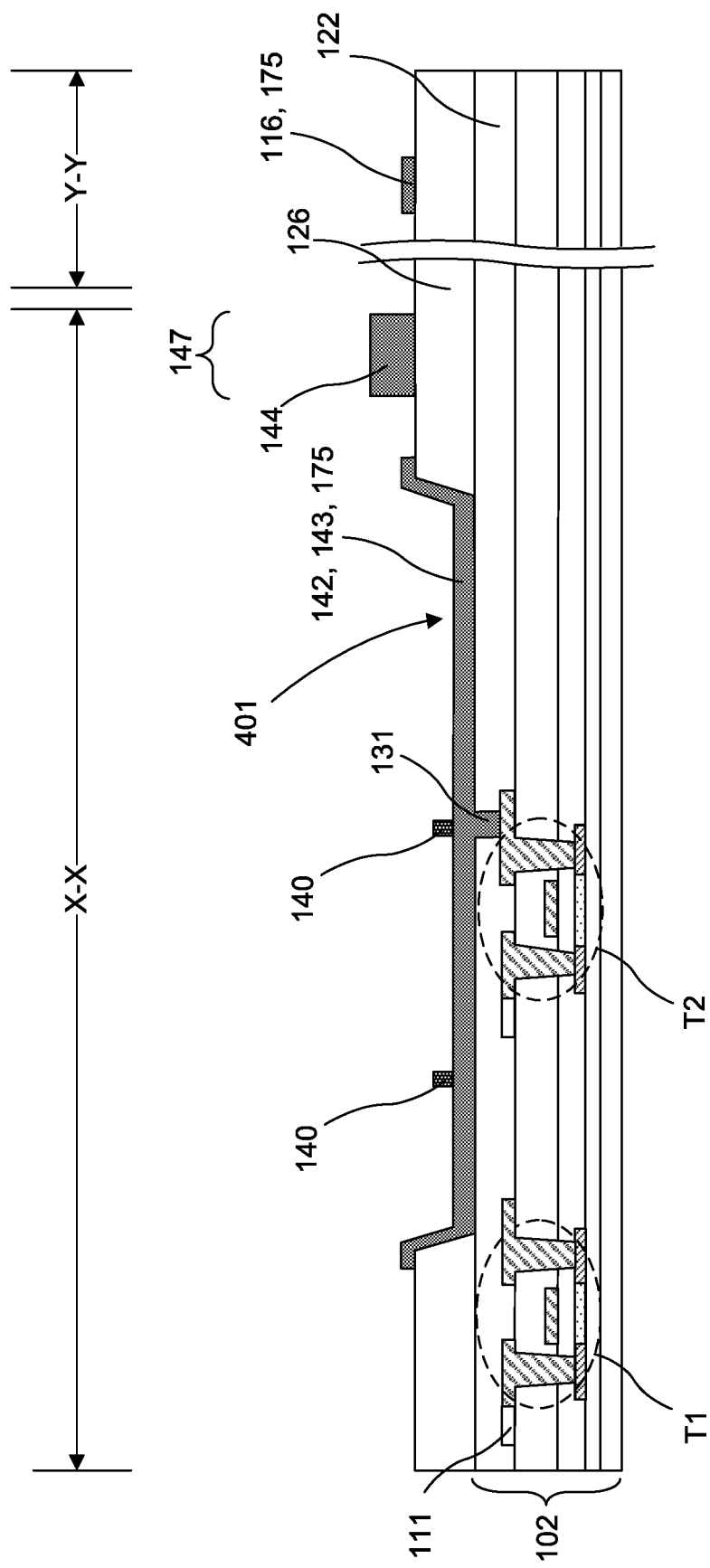
FIG. 1D is a side-view illustration of the active matrix display panel of FIG. 1A taken along lines X-X and Y-Y in accordance with an embodiment of the invention.

Referring now to FIGS. 1B-1D, openings 131 may be formed in the planarization layer 122 to contact the working circuitry. Exemplary planarization materials include benzocyclobutene (BCB) and acrylic. The working circuitry can include traditional 2T1C (two transistors, one capacitor) circuits including a switching transistor, a driving transistor, and a storage capacitor. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for process variations of the driver transistor and the micro LED devices, or for their instabilities. Furthermore, while embodiments of the invention are described and illustrated with regard to top gate transistor structures in the TFT substrate 102, embodiments of the invention also contemplate the use of bottom gate transistor structures. Likewise, while embodiments of the invention are described and illustrated with regard to a top emission structure, embodiments of the invention also contemplate the use of bottom, or both top and bottom emission structures. In addition, embodiments of the invention are described and illustrated below specifically with regard to a high side drive configuration including ground tie lines and ground ring. In a high side drive configuration a LED may be on the drain side of a PMOS driver transistor or a source side of an NMOS driver transistor so that the circuit is pushing current through the p-terminal of the LED. Embodiments of the invention are not so limited may also be practiced with a low side drive configuration in which case the ground tie lines and ground ring become the power line in the panel and current is pulled through the n-terminal of the LED.

A patterned bank layer 126 including bank openings 128 is formed over the planarization layer 122. Bank layer 126 may be formed by a variety of techniques such as ink jet printing, screen printing, lamination, spin coating, spray coating, CVD, and PVD. Bank layer 126 may be opaque, transparent, or semi-transparent to the visible wavelength. Bank layer 126 may be formed of a variety of insulating materials such as, but not limited to, photo-definable acrylic, photoresist, silicon oxide ($SiO_2$), silicon nitride ($SiN_x$), poly(methyl methacrylate) (PMMA), benzocyclobutene (BCB), polyimide, acrylate, epoxy, and polyester. In an embodiment, bank player is formed of an opaque material such as a black matrix material. Exemplary insulating black matrix materials include organic resins, glass pastes, and resins or pastes including a black pigment, metallic particles such as nickel, aluminum, molybdenum, and alloys thereof, metal oxide particles (e.g. chromium oxide), or metal nitride particles (e.g. chromium nitride).

In accordance with embodiments of the invention, the thickness of the bank layer 126 and width of the bank openings 128 described with regard to the following figures may depend upon the height of the micro LED devices to be mounted within the opening, height of the transfer heads transferring the micro LED devices, and resolution of the display panel. In an embodiment, the resolution, pixel density, and subpixel density of the display panel may account for the width of the bank openings 128. For an exemplary 55 inch television with a 40 PPI (pixels per inch) and 211 μm subpixel pitch, the width of the bank openings 128 may be anywhere from a few microns to 206 μm to account for an exemplary 5 μm wide surrounding bank structure between bank openings 128. For an exemplary display panel with 440 PPI and a 19 μm subpixel pitch, the width of the bank openings 128 may be anywhere from a few microns to 14 μm to account for an exemplary 5 μm wide surrounding bank structure. Width of the bank structure (i.e. between bank openings 128) may be any suitable size, so long as the structure supports the required processes and is scalable to the required PPI.

Table 1 provides a list of exemplary implementations in accordance with embodiments of the invention for various red-green-blue (RGB) displays with 1920×1080p and 2560×1600 resolutions. In the exemplary embodiments, the 40 PPI pixel density may correspond to a 55 inch 1920×1080p resolution television, and the 326 and 440 PPI pixel density may correspond to a handheld device with RETINA (RTM) display. It is to be appreciated that embodiments of the invention are not limited to RGB color schemes or the 1920×1080p or 2560×1600 resolutions, and that the specific resolution and RGB color scheme is for illustrational purposes only.

TABLE 1

| Display Substrate | Pixel Pitch (x, y) | Sub-Pixel pitch (x, y) | Pixels per inch (PPI) | Possible transfer head array pitch |
|---|---|---|---|---|
| 55" 1920 × 1080 | (634 μm, 634 μm) | (211 μm, 634 μm) | 40 | X: Multiples or fractions of 211 μm<br>Y: Multiples or fractions of 634 μm |
| 10" 2560 × 1600 | (85 μm, 85 μm) | (28 μm, 85 μm) | 299 | X: Multiples or fractions of 28 μm<br>Y: Multiples or fractions of 85 μm |
| 4" 640 × 1136 | (78 μm, 78 μm) | (26 μm, 78 μm) | 326 | X: Multiples or fractions of 26 μm<br>Y: Multiples or fractions of 78 μm |
| 5" 1920 × 1080 | (58 μm, 58 μm) | (19 μm, 58 μm) | 440 | X: Multiples or fractions of 19 μm<br>Y: Multiples or fractions of 58 μm |

In accordance with embodiments of the invention, the thickness of the bank layer 126 is not too thick in order for the bank structure to function. Thickness may be determined by the micro LED device height and a predetermined viewing angle. For example, where sidewalls of the bank openings 128 make an angle with the planarization layer 122, shallower angles may correlate to a wider viewing angle of the system. In an embodiment, exemplary thicknesses of the bank layer 126 may be between 1 μm-50 μm. In an embodiment the thickness of the bank layer 126 is within 5 μm of the thickness of the micro LED devices 400. In an embodiment, the micro LED devices 400 to be transferred are taller than the bank layer thickness.

In accordance with embodiments of the invention, a dam structure 147 is formed atop the patterned bank layer 126. The dam structure 147 may be formed from the same layer used to form the patterned bank layer 126, or may be formed of a separate layer. In the embodiment illustrated in FIG. 1B, the dam structure 147 includes a patterned dam layer 127 formed atop the bank layer 126. Dam layer 127 may be formed of the same material as the bank layer 126. Alternatively, dam layer 127 can be electrically conductive. In accordance with embodiments of the invention, the dam layer is elevated above the patterned bank layer 126 a sufficient height to accommodate a passivation layer 210, further described with regard to FIG. 5B. In an embodiment, the dam layer 127 is between 0.5 μm-5 μm thick, or more particularly 1 μm-2 μm thick, though other thicknesses are possible.

In some embodiments, a patterned conductive layer 175 is then formed over the patterned bank layer 126 and a top surface 129 of patterned dam layer 127. In one embodiment the patterned conductive layer 175 includes reflective bank structure 142 formed within the bank openings 128 and in electrical contact with the working circuitry. For example, a reflective bank structure 142 can be formed for each subpixel, wherein each reflective bank structure functions as a bottom electrode 143 and is independently addressable from working circuitry within the substrate. Accordingly, all micro LED devices that are bonded to one reflective bank structure of a subpixel are addressed together. The patterned conductive layer 175 may also optionally include the ground tie lines 144 and/or the ground ring 116, as illustrated in FIG. 1B. As used herein the term ground "ring" does not require a circular pattern, or a pattern that completely surrounds an object. In addition, while the following embodiments are described and illustrated with regard to a ground line in the form of a ground ring 116 at least partially surrounding the pixel area on three sides, it is to be appreciated that embodiments of the invention can also be practiced with a ground line running along one side (e.g. left, right, bottom, top), or two sides (a combination of two of the left, right, bottom, top) of the pixel area. Accordingly, it is to be appreciated that in the following description the reference to and illustration of a ground ring, could potentially be replaced with a ground line where system requirements permit.

In the embodiments illustrated an arrangement of ground tie lines 144 may run between bank openings 128 in the pixel area 104 of the display panel 100. The ground tie lines 144 may also form a portion of the dam structure 147 and may be elevated above the reflective bank structure 142. In the embodiment illustrated in FIG. 1B, dam structure 147 including the dam layer 127 and ground tie line 144 runs between the bank openings 128 in the pixel area 104. Referring now to FIG. 1C, in an embodiment, a plurality of openings 149 are formed in the dam layer 127, and optionally the bank layer 126 and planarization layer 122, to expose the plurality of ground tie lines 144. For example, the ground tie lines 144 and ground ring 116 may have been formed during formation of the working circuitry, or making contact with the working circuitry in substrate 102. The number of openings 149 may or may not have a 1:1 correlation to the number of columns (top to bottom) of bank openings 128. For example, in the embodiment illustrated in FIG. 1A, a ground tie opening 149 is formed for each column of bank openings 128, however, this is not required and the number of ground tie openings 149 may be more or less than the number of columns of bank openings 128. Likewise, the number of ground tie lines 144 may or may not have a 1:1 correlation to the number of rows (left to right) of bank openings. For example, in the embodiment illustrated a ground tie line 144 is formed for every two rows of bank openings 128, however, this is not required and the number of ground tie lines 144 may have a 1:1 correlation, or any 1:n correlation to the number (n) of rows of bank openings 128. In other embodiments, ground tie lines can run both in the column-wise direction and row-wise direction.

In the embodiment illustrated in FIG. 1B, the reflective bank structures 142, ground tie lines 144, and ground ring 116 can be formed of the same conductive layer. In the embodiment illustrated in FIG. 1C, the reflective bank structures 142 and via contacts 145 can be formed of the same conductive layer. As illustrated in FIG. 1C, the dam structure 147 may include the dam layer 127 and via contact 145 on top of the dam layer 127, where via contact 145 is elevated above the reflective bank structure 142. The patterned conductive layer 175 may be formed of a number of conductive and reflective materials, and may include more than one layer. In an embodiment, a patterned conductive layer 175 comprises a metallic film such as aluminum, molybdenum, titanium, titanium-tungsten, silver, or gold, or alloys thereof. The patterned conductive layer 175 may include a conductive material such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the patterned conductive layer 175 includes a stack of a conductive material and a reflective conductive material. In an embodiment, the patterned conductive layer 175 includes a 3-layer stack including top and bottom layers and a reflective middle layer wherein one or both of the top and bottom layers are transparent. In an embodiment, the patterned conductive layer 175 includes a conductive oxide-reflective metal-conductive oxide 3-layer stack. The conductive oxide layers may be transparent. For example, the patterned conductive layer 175 may include an ITO-silver-ITO layer stack. In such a configuration, the top and bottom ITO layers may prevent diffusion and/or oxidation of the reflective metal (silver) layer. In an embodiment, the patterned conductive layer 175 includes a Ti—Al—Ti stack, or a Mo—Al—Mo-ITO stack. In an embodiment, the patterned conductive layer 175 includes an ITO-Ti—Al—Ti-ITO stack. In an embodiment, the patterned conductive layer 175 is 1 μm or less in thickness. The patterned conductive layer 175 may be deposited using a suitable technique such as, but not limited to, PVD.

The ground tie lines 144 and/or ground ring 116 can also be formed of a different conductive layer than the reflective bank structure 142. Referring now to FIG. 1D, in an embodiment the ground tie line 144 is the dam structure 147. In such an embodiment, the ground tie line 144 can be formed separately from the reflective bank structure 142, and ground ring 116. As illustrated, the ground tie line 144 is thicker than the reflective bank structure 142 and is elevated above the reflective bank structure 142 in order to function as a dam structure for the passivation layer to be formed. In the embodiment illustrated in FIG. 1D, ground tie line 144 may be any suitable thickness to function as a dam structure, such as 1 µm-5 µm as described above with regard to dam layer 127.

Still referring to the embodiments illustrated in FIG. 1A-D, one or more bonding layers 140 may be formed on the reflective bank structure 142 to facilitate bonding of micro LED devices. In the specific embodiment illustrated two bonding layers 140 are illustrated for bonding a pair of micro LED devices. In an embodiment, the bonding layer 140 is selected for its ability to be inter-diffused with a bonding layer on the micro LED device (yet to be placed) through bonding mechanisms such as eutectic alloy bonding, transient liquid phase bonding, or solid state diffusion bonding as described in U.S. patent application Ser. No. 13/749,647. In an embodiment, the bonding layer 140 has a melting temperature of 250° C. or lower. For example, the bonding layer 140 may include a solder material such as tin (232° C.) or indium (156.7° C.), or alloys thereof. Bonding layer 140 may also be in the shape of a post. In accordance with some embodiments of the invention, taller bonding layers 140 may provide an additional degree of freedom for system component leveling, such as planarity of the array of micro LED devices with the TFT substrate during the micro LED device transfer operation and for variations in height of the micro LED devices, due to the change in height of the liquefied bonding layers as they spread out over the surface during bonding, such as during eutectic alloy bonding and transient liquid phase bonding. The width of the bonding layers 140 may be less than a width of a bottom surface of the micro LED devices to prevent wicking of the bonding layers 140 around the sidewalls of the micro LED devices and shorting the quantum well structures.

Figure 2A:
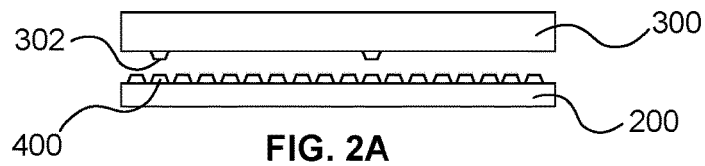
FIGS. 2A-2F illustrated a method of transferring a plurality of micro LED devices to a plurality of reflective bank structures in accordance with an embodiment of the invention.
Figure 2B:
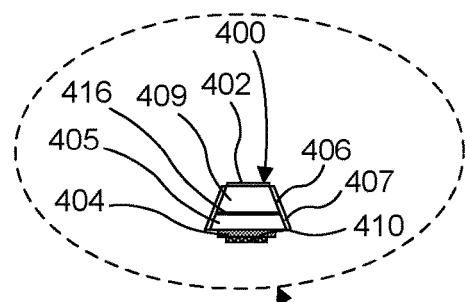
Figure 2B:
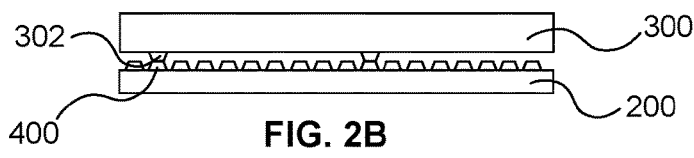
Figure 2C:
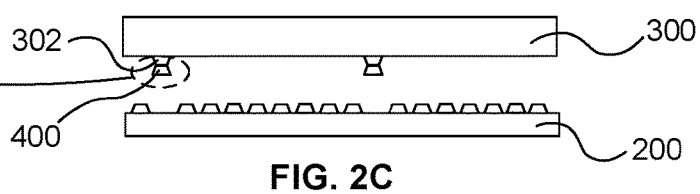

FIGS. 2A-2F illustrated a method of transferring a plurality of micro LED devices to a plurality of reflective bank structures in accordance with an embodiment of the invention. Referring to FIG. 2A, an array of transfer heads 302 supported by a transfer head substrate 300 are positioned over an array of micro LED devices 400 supported on a carrier substrate 200. A heater and heat distribution plate may optionally be attached to the transfer head substrate 300. A heater and heat distribution plate may optionally be attached to the carrier substrate 200. The array of micro LED devices 400 are contacted with the array of transfer heads 302, as illustrated in FIG. 2B, and picked up from the carrier substrate 200 as illustrated in FIG. 2C. In an embodiment, the array of micro LED devices 400 are picked up with an array of transfer heads 302 operating in accordance with electrostatic principles, that is, they are electrostatic transfer heads.

The number of micro LED devices picked up with the array of transfer heads may or may not match the pitch of transfer heads. In an exemplary embodiment, an array of transfer heads separated by a pitch of 58 µm picks up an array of micro LED devices with a pitch of approximately 6.44 µm. In this manner the transfer heads pick up every ninth micro LED device for transfer to the backplane. However, it is to be understood that the dimensions are exemplary and embodiments of the invention are not so limited.

Still referring to FIG. 2C, a close-up illustration is provided of an exemplary micro LED device 400. In the particular embodiment illustrated, the micro LED devices 400 include a micro p-n diode between a bottom contact 404 and top contact 402. In an embodiment, the micro p-n diode is several micros thick, such as 30 µm or less, or even 5 µm or less, with the top and bottom contacts 402, 404 being 0.1 µm-2 µm thick. The micro p-n diode may include an n-doped layer 409, a p-doped layer 405, and one or more quantum well layers 416 between the n-doped layer and p-doped layer. In the particular embodiment illustrated in FIG. 2C the n-doped layer 409 is illustrated as being above the p-doped layer 405. Alternatively, the p-doped layer 405 may be above the n-doped layer 409. The micro LED devices 400 may have straight or tapered sidewalls 406 (from top to bottom). The top and bottom contacts 402, 404 may include one or more layers and can be formed of a variety of electrically conducting materials including metals, conductive oxides, and conductive polymers. The top and bottom contacts 402, 404 may be transparent or semi-transparent to the visible wavelength spectrum (e.g. 380 nm-750 nm) or opaque. The top and bottom contacts 402, 404 may optionally include a reflective layer, such as a silver layer. In an embodiment, a conformal dielectric barrier layer 407 may optionally be formed along the sidewalls 406 of the p-n diode to electrically passivate the quantum well 416, and optionally along the top or bottom surface of the micro p-n diode. The conformal dielectric barrier layer 407 may be thinner than the p-n diode so that it forms an outline of the topography of the p-n diode it is formed on. For example, the conformal dielectric barrier layer 407 may be approximately 50-600 angstroms thick aluminum oxide. A bonding layer 410 may be formed below the bottom contact 404 of micro LED device 400 facilitate bonding to the reflective bank structure 142 or bonding layer 140 on the reflective bank structure. In an embodiment, bonding layer 410 includes a material such as gold, silver, molybdenum, aluminum, silicon, or an alloy thereof.

Figure 2D:
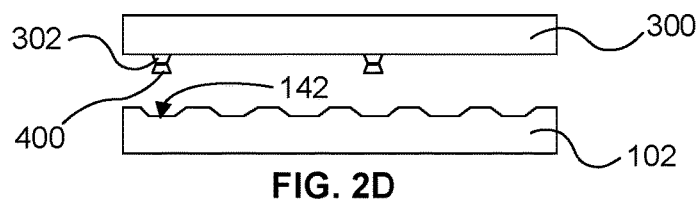

FIG. 2D is a cross-sectional side view illustration of a transfer head 302 holding a plurality of micro LED devices 400 over a TFT substrate 102 in accordance with an embodiment of the invention. In the embodiment illustrated, the transfer head 302 is supported by a transfer head substrate 300. As described above, a heater and heat distribution plate may optionally be attached to the transfer head substrate to apply heat to the transfer heads 302. A heater and heat distribution plate may also, or alternatively, optionally be used to transfer heat to the bonding layers 140 on the TFT substrate 102 and/or optional bonding layers 410 on the micro LED devices 400. In accordance with some embodiments, the top surface of the array of micro LED devices is higher than the top surface of the reflective bank structures so as to prevent the transfer heads from being damaged by or damaging the backplane during placement of the micro LED devices within bank openings. Furthermore, the top surface of the micro LED device may be elevated higher than the top surface of the reflective bank structure by a sufficient amount to allow the passivation layer to be formed over the reflective bank structure while the micro LED device protrudes above a top surface of the passivation layer. Furthermore, the top surface of the dam structures 147 atop the bank layer 126 does not contact the array of transfer heads 302 or substrate 300 supporting the transfer heads 302 so as to not interference with the transfer process.

Figure 2E:
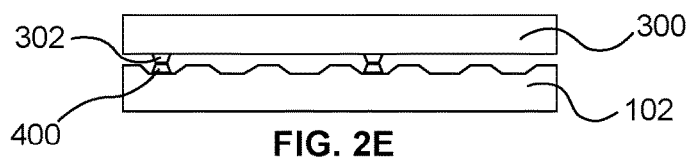

Referring now to FIG. 2E the TFT substrate 102 is contacted with the array of micro LED devices 400. In the embodiment illustrated, contacting the TFT substrate 102 with the array of micro LED devices 400 includes contacting bonding layer 140 with a micro LED device bonding layer 410 for each respective micro LED device. In an embodiment, each micro LED device bonding layer 410 is wider than a corresponding bonding layer 140. In an embodiment, energy is transferred from the electrostatic transfer head assembly and through the array of micro LED devices 400 to bond the array of micro LED devices 400 to the TFT substrate 102. For example, thermal energy may be transferred to facilitate several types of bonding mechanisms such as eutectic alloy bonding, transient liquid phase bonding, and solid state diffusion bonding. The transfer of thermal energy may also be accompanied by the application of pressure from the electrostatic transfer head assembly.

Figure 2F:
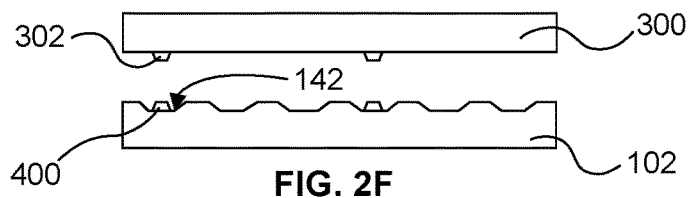

Referring to FIG. 2F, in an embodiment, the transfer of energy liquefies bonding layer 140. The liquefied bonding layer 140 may act as a cushion and partially compensate for system uneven leveling (e.g. nonplanar surfaces) between the array of micro devices 400 and the TFT substrate during bonding, and for variations in height of the micro LED devices. In the particular implementation of transient liquid phase bonding the liquefied bonding layer 140 inter-diffuses with the micro LED device bonding layer 410 to form an inter-metallic compound layer with an ambient melting temperature higher than the ambient melting temperature of the bonding layer 140. Accordingly, transient liquid phase bonding may be accomplished at or above the lowest liquidus temperature of the bonding layers. In some embodiments of the invention, the micro LED device bonding layer 410 is formed of a material having a melting temperature above 250° C. such as bismuth (271.4° C.), or a melting temperature above 350° C. such as gold (1064° C.), copper (1084° C.), silver (962° C.), aluminum (660° C.), zinc (419.5° C.), or nickel (1453° C.), and the TFT substrate bonding layer 140 has a melting temperature below 250° C. such as tin (232° C.) or indium (156.7° C.).

In this manner, the substrate supporting the TFT substrate 102 can be heated to a temperature below the melting temperature of the bonding layer 140, and the substrate supporting the array of transfer heads is heated to a temperature below the melting temperature of bonding layer 410, but above the melting temperature of bonding layer 140. In such an embodiment, the transfer of heat from the electrostatic transfer head assembly through the array of micro LED devices 400 is sufficient to form the transient liquid state of bonding layer 140 with subsequent isothermal solidification as an inter-metallic compound. While in the liquid phase, the lower melting temperature material both spreads out over the surface and diffused into a solid solution of the higher melting temperature material or dissolves the higher melting temperature material and solidifies as an inter-metallic compound. In a specific embodiment, the substrate supporting the array of transfer heads is held at 180° C., bonding layer 410 is formed of gold, and bonding layer 140 is formed of indium.

Following the transfer of energy to bond the array of micro LED devices 400 to the TFT substrate, the array of micro LED devices 400 are released onto the receiving substrate and the array of electrostatic transfer heads are moved away as illustrated in FIG. 2F. Releasing the array of micro LED devices 400 may be accomplished with a variety of methods including turning off the electrostatic voltage sources, lowering the voltage across the electrostatic transfer head electrodes, changing a waveform of an AC voltage, and grounding the voltage sources.

Figure 3A:
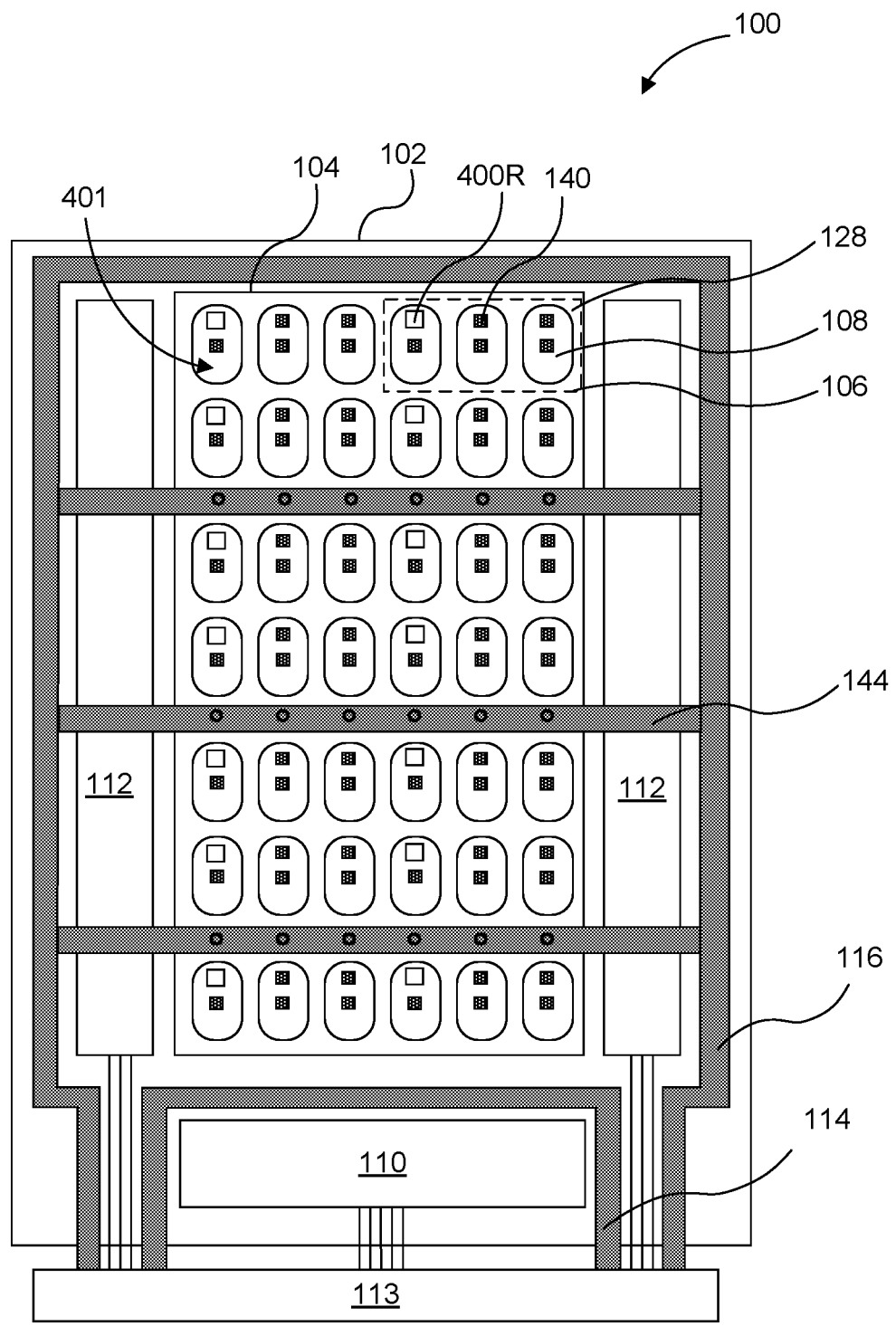
FIGS. 3A-3F are top view illustrations for a sequence of transferring an array of micro LED devices with different color emission spectra in accordance with an embodiment of the invention.
Figure 3B:
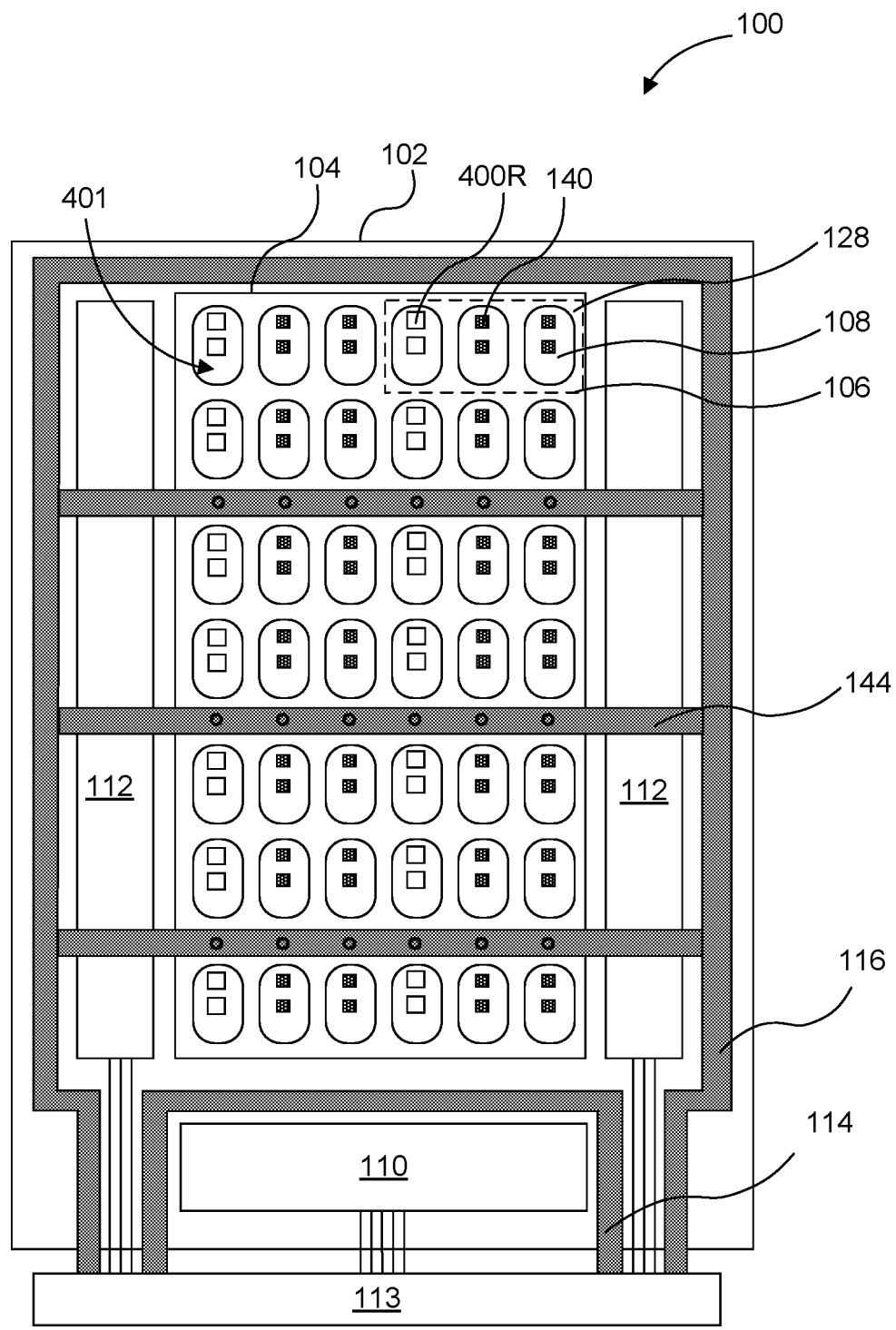

Referring now to FIGS. 3A-3F, a sequence of transferring an array of micro LED devices 400 with different color emissions is illustrated in accordance with an embodiment of the invention. In the particular configuration illustrated in FIG. 3A, a first transfer procedure has been completed for transferring an array of red-emitting micro LED devices 400R from a first carrier substrate to the reflective bank structures 142 of a TFT substrate 102. For example, where the micro LED devices 400R are designed to emit a red light (e.g. 620-750 nm wavelength) the micro p-n diode may include a material such as aluminum gallium arsenide (AlGaAs), gallium arsenide phosphide (GaAsP), aluminum gallium indium phosphide (AlGaInP), and gallium phosphide (GaP). Referring to FIG. 3B, a second transfer procedure has been completed for transferring a redundant array of red-emitting micro LED devices 400R. For example, the redundant array could be transferred from a different carrier substrate, or from a different area (e.g. from opposite side, different areas do not overlap, or random selection) of the first carrier substrate in order to decrease the probability of transferring a second array from a same correlated defect area or contaminated area (e.g. particulates) of the first carrier substrate. In this manner, by transferring from two uncorrelated areas it may be possible to reduce the likelihood of transferring two defective micro LED devices 400 to the same reflective bank structure 142, or alternatively transferring no micro LED devices 400 to a single reflective bank structure 142 because it was not possible to pick up the micro LED devices in a defective or contaminated area of a carrier substrate. In yet another embodiment, by using a redundant array from two different wafers it may be possible to obtain a mix of both colors, and tune the average power consumption of the display based upon a pre-existing knowledge of the primary emission wavelength of the micro LED devices on different wafers. For example, where the first wafer is known to have an average red emission of 630 nm with a first power consumption while a second wafer is known to have an average red emission of 610 nm with a second power consumption, the redundancy array can be composed of micro LED devices from both wafers to obtain an average power consumption or alternate color gamut.

Figure 3C:
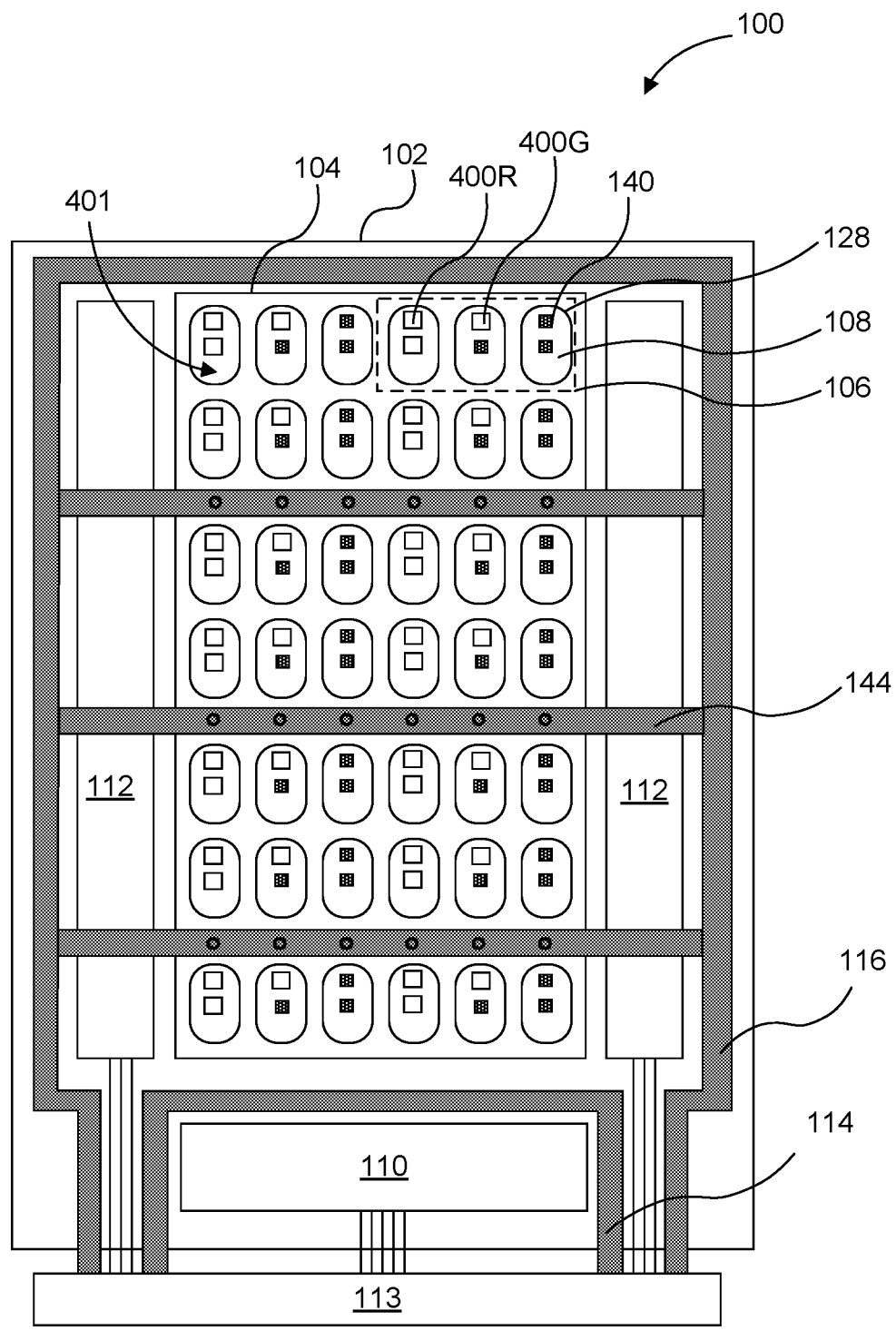
Figure 3D:
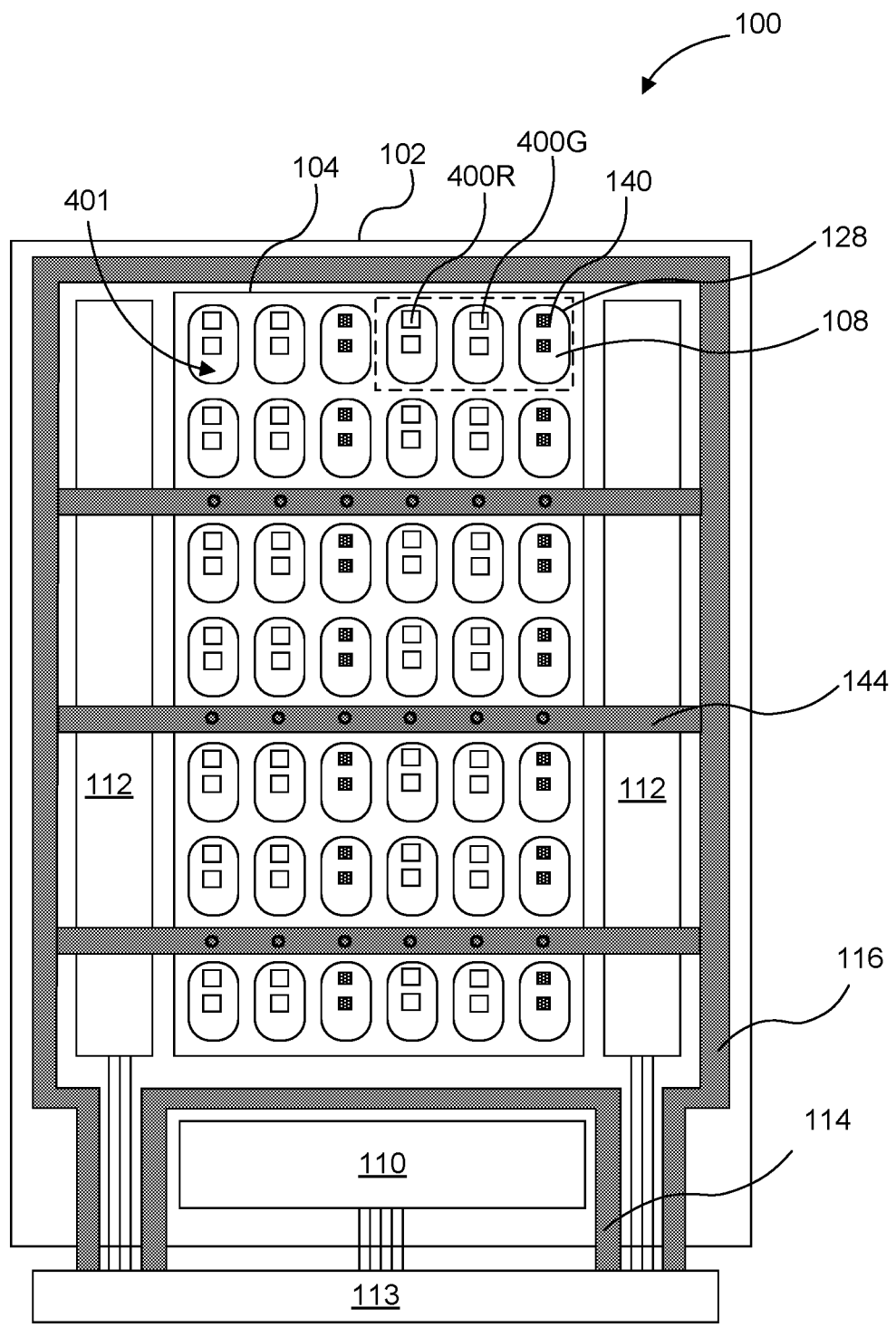

Referring to FIG. 3C, a third transfer procedure has been completed for transferring an array of green-emitting micro LED devices 400G from a second carrier substrate to the TFT substrate 102. For example, where the micro LED devices 400G are designed to emit a green light (e.g. 495-570 nm wavelength) the micro p-n diode may include a material such as indium gallium nitride (InGaN), gallium nitride (GaN), gallium phosphide (GaP), aluminum gallium indium phosphide (AlGaInP), and aluminum gallium phosphide (AlGaP). A fourth transfer procedure for transferring a redundant array of green-emitting micro LED devices 400G is illustrated in FIG. 3D, similarly as before.

Figure 3E:
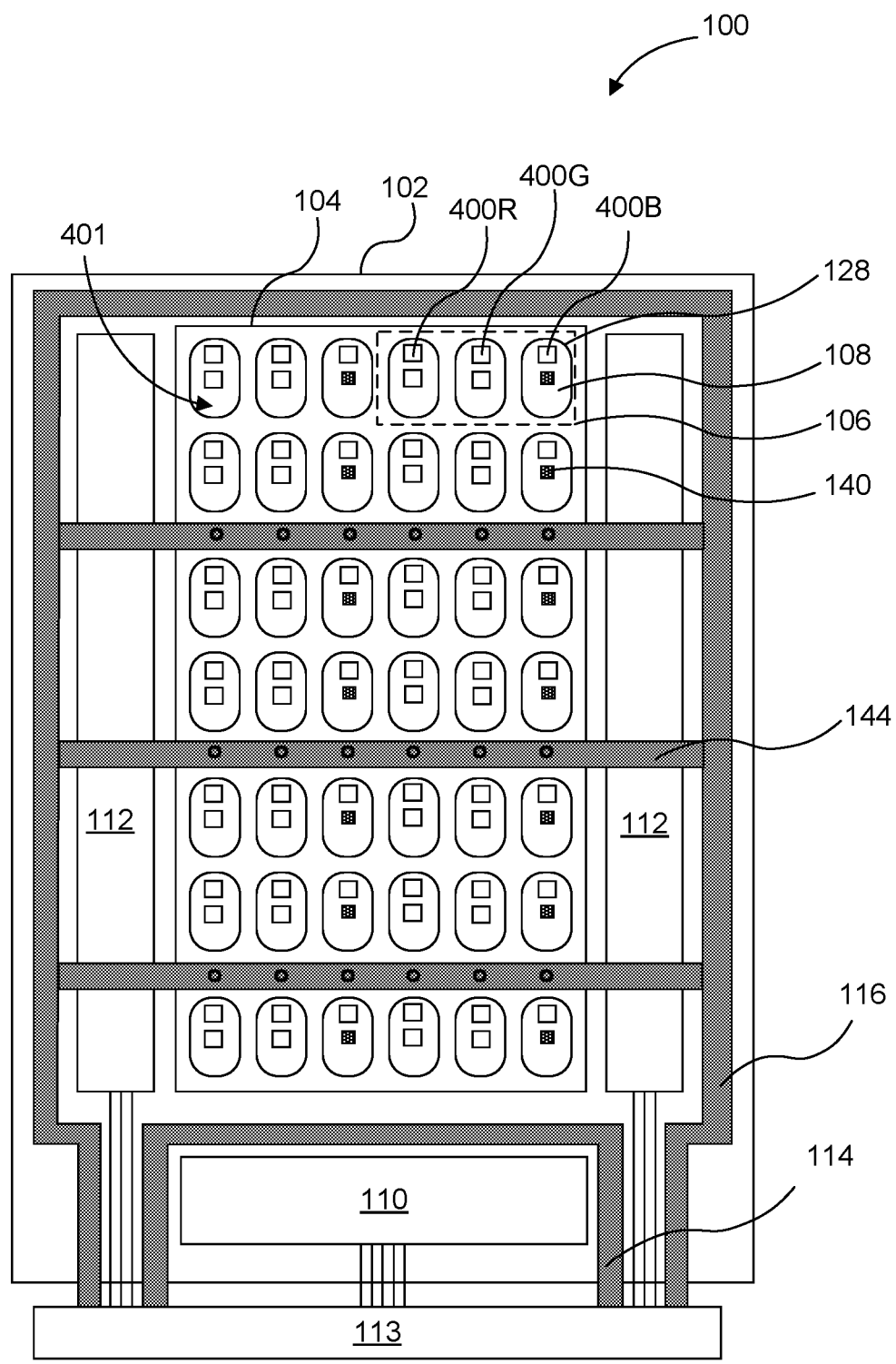
Figure 3F:
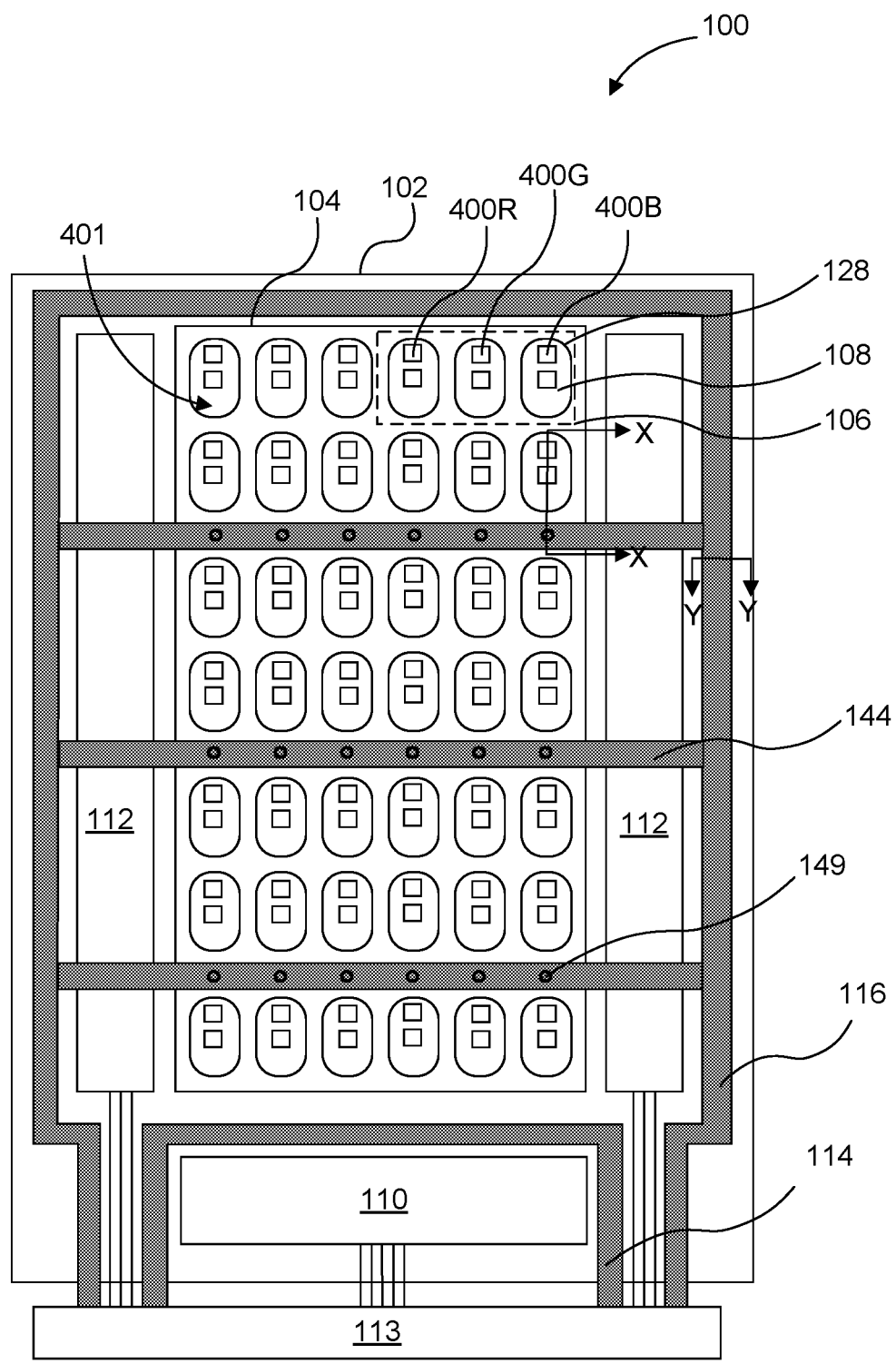

Referring to FIG. 3E, a fifth transfer procedure has been completed for transferring an array of blue-emitting micro LED devices 400B from a third carrier substrate to reflective bank structures 142 of the TFT substrate 102. For example, where the micro LED devices 400B are designed to emit a blue light (e.g. 450-495 nm wavelength) the micro p-n diode may include a material such as gallium nitride (GaN), indium gallium nitride (InGaN), and zinc selenide (ZnSe). A sixth transfer procedure for transferring a redundant array of blue-emitting micro LED devices 400B is illustrated in FIG. 3F, similarly as before.

In the particular embodiments described above with regard to FIGS. 3A-3F, the first and second micro LED devices 400 for each subpixel are separately transferred. For example, this may reduce the probability of correlated defects. However, in other embodiments it is possible to simultaneously transfer the first and second micro LED devices from the same carrier substrate. In this manner, simultaneous transfer may increase production throughput while still offering some of the benefits of a redundancy scheme at the expense of the possibility of correlated defects due to transferring micro LED devices from the same area of a carrier substrate. In such an embodiment the processing sequence would resemble the sequence in the following order of FIGS. 3B, 3D, 3F.

Figure 4A:
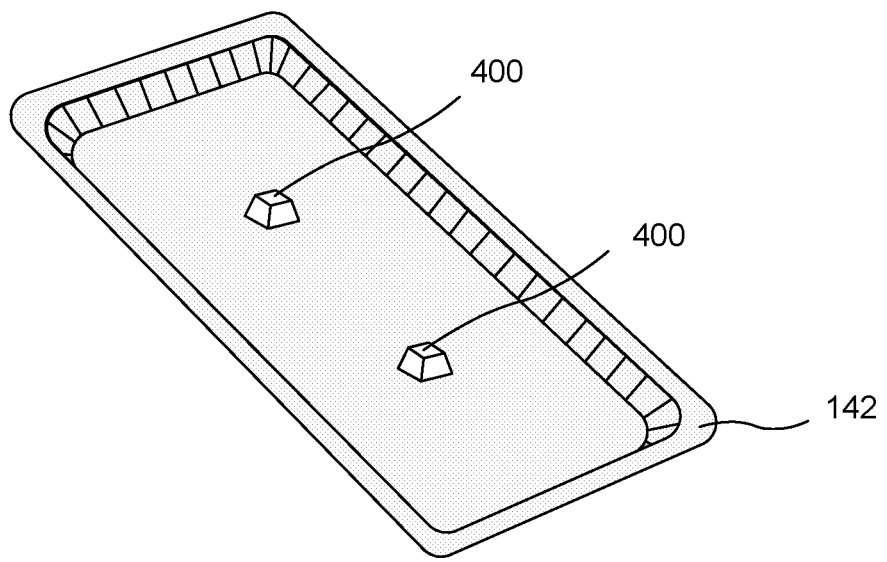
FIG. 4A is a perspective view illustration redundant pair of micro LED devices within a reflective bank structure in accordance with an embodiment of the invention.
Figure 4B:
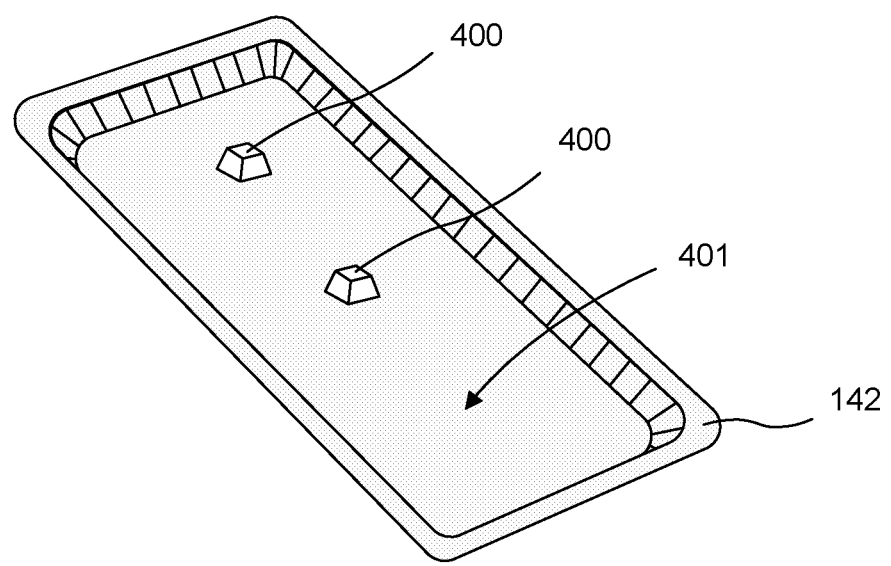
FIG. 4B is a perspective view illustration redundant pair of micro LED devices and repair site within a reflective bank structure in accordance with an embodiment of the invention.

While embodiments of the invention thus far have been described with regard to an arrangement of micro LED devices within reflective bank structures with a redundancy and repair scheme, such a configuration is not required. In an embodiment, a single micro LED device is placed within a reflective bank structure. In the embodiment illustrated in FIG. 4A, a redundant pair of micro LED devices 400 are placed within a reflective bank structure 142. In the embodiment illustrated in FIG. 4B, a redundant pair of micro LED devices 400 are placed within a reflective bank structure 142 with a bare repair site 401. In interests of inclusion of many of the various possible configurations together in the same description, the remainder of the description is made with reference to a redundancy and repair scheme.

Figure 5A:
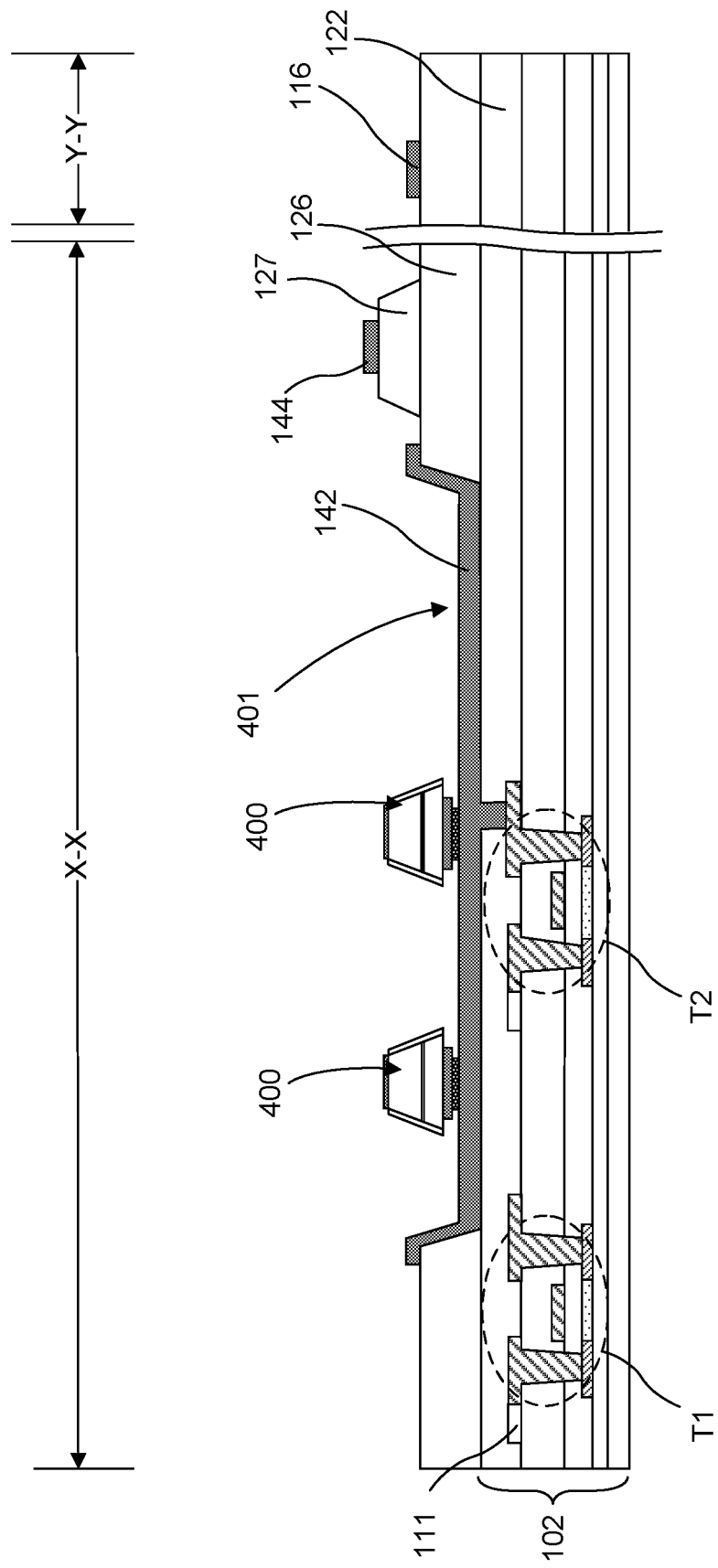
FIG. 5A is a side-view illustration of the active matrix display panel of FIG. 3F taken along lines X-X and Y-Y after the transfer of a pair of micro LED devices to the reflective bank structure in accordance with an embodiment of the invention.
Figure 5B:
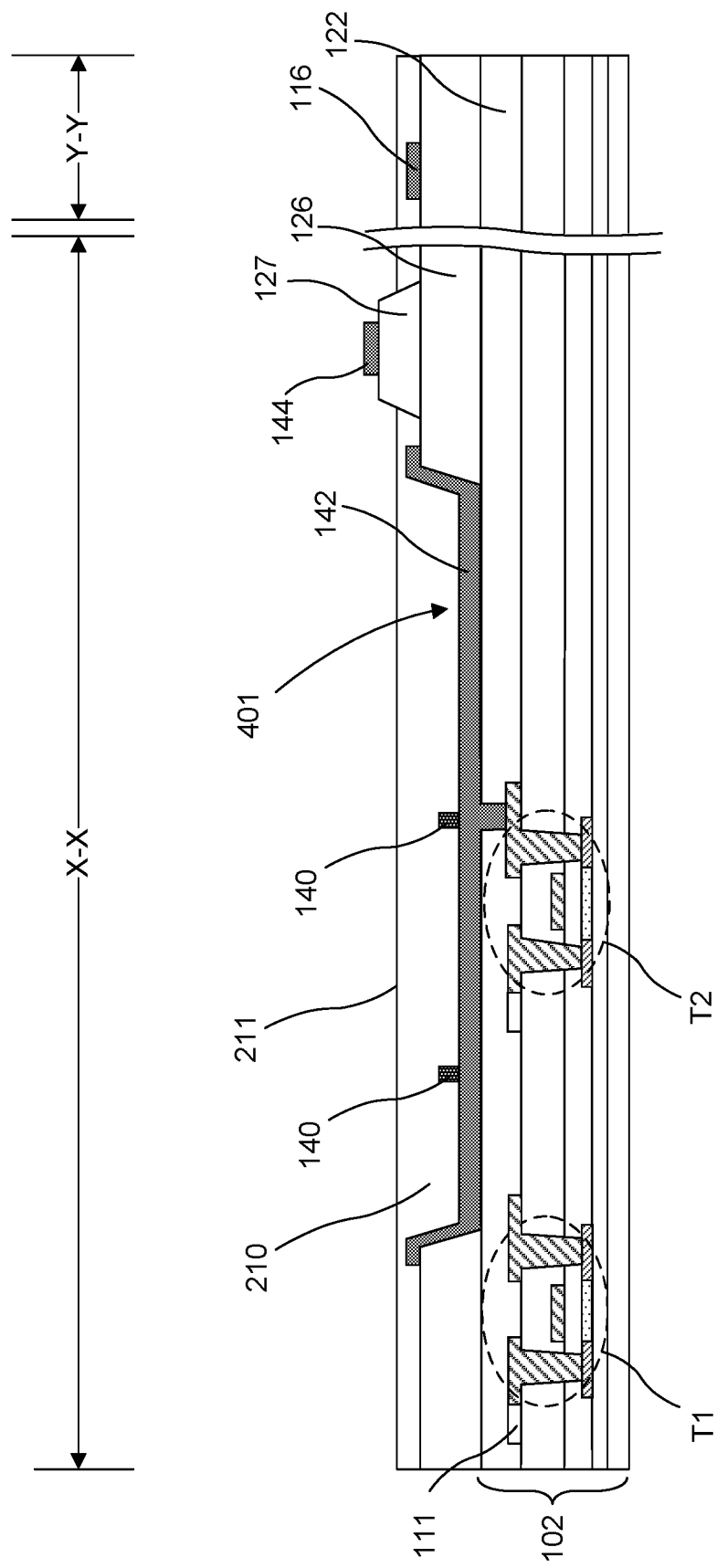
FIG. 5B is a side-view illustration of the active matrix display panel of FIG. 1A taken along lines X-X and Y-Y after the application of a passivation layer over the bank layer in accordance with an embodiment of the invention.
Figure 5C:
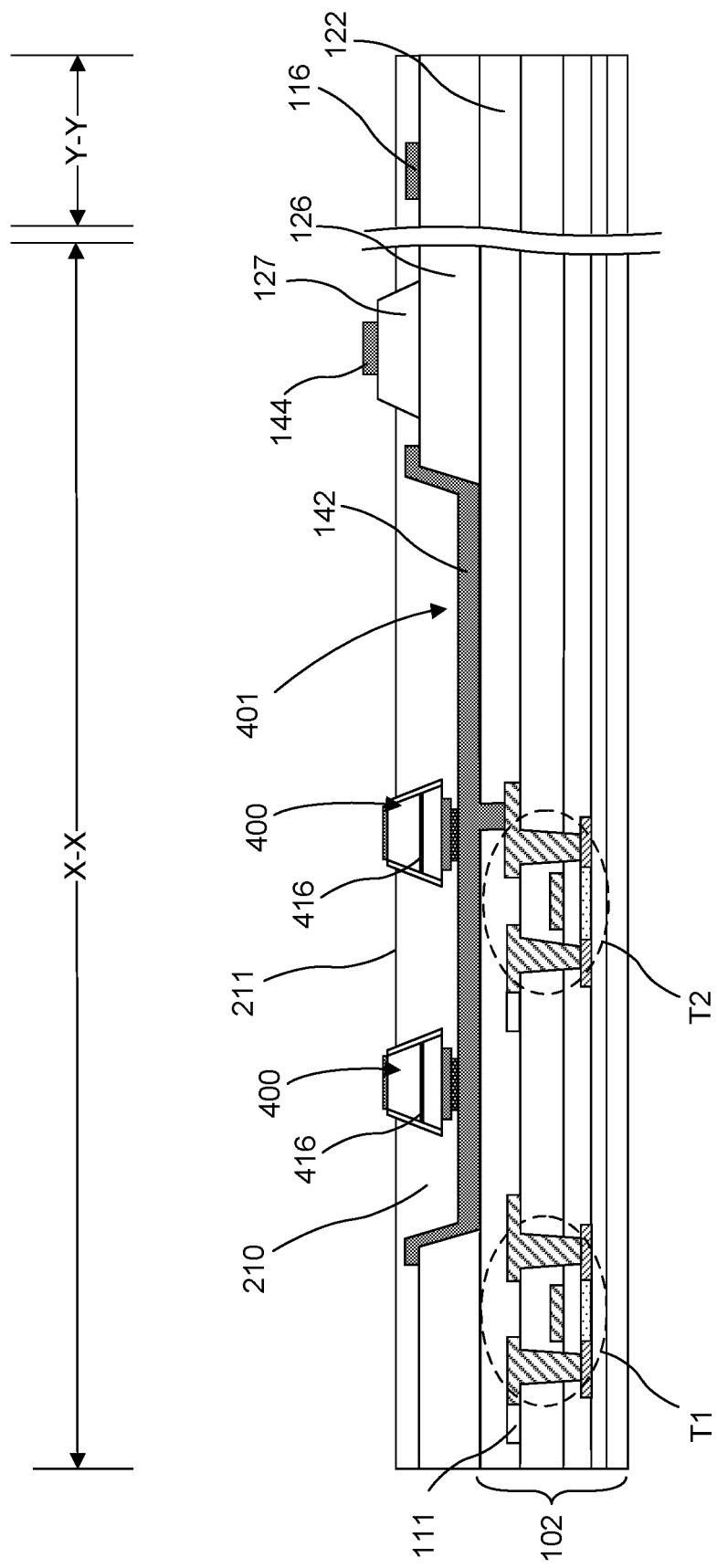
FIG. 5C is a side-view illustration of the active matrix display panel of FIG. 3F taken along lines X-X and Y-Y after the transfer of a pair of micro LED devices and application of a passivation layer over the bank layer in accordance with an embodiment of the invention.

Referring now to FIGS. 5A-5C, different sequences are illustrated for transferring the micro LED devices to the reflective bank structures and forming the passivation layer over the reflective bank structures and around the micro LED devices. FIG. 5A illustrates an embodiment in which the micro LED devices 400 are transferred to the reflective bank structures prior to forming the passivation layer. FIG. 5B illustrates an embodiment in which the passivation layer 210 is formed over the bank layer and reflective bank structures prior to transferring the micro LED devices. FIG. 5C illustrates a configuration that can be formed by either forming the passivation layer prior to transferring the micro LED devices, or by punching the micro LED devices through the passivation layer. As illustrated, the passivation layer 210 may be formed over the bank layer 126 and around the sidewalls of the micro LED devices 400 within the array of reflective bank structures 142. In an embodiment, where the micro LED devices 400 are vertical LED devices, the passivation layer 210 covers and spans the quantum well structure 416. The passivation layer 210 may also cover any portions of the reflective bank structure 142 in order to prevent possible shorting. Accordingly, the passivation layer 210 may be used to passivate the quantum well structure 416, as well as the reflective bank structure 142. In accordance with embodiments of the invention, the passivation layer 210 is not formed on the top surface of the micro LED devices 400, such as top conductive contact 402, or on the top surface of the tie line 144 of the dam structure 147. In some embodiments, a plasma etching process, e.g. $O_2$, Ar, or $CF_4$ plasma etch, can be used after forming the passivation layer 210 to etch back the passivation layer 210, ensuring the top surface of the micro LED devices 400, such as top conductive contacts 402, and the tie line 144 of the dam structure 147 are exposed to enable the top conductive electrode layers 318 to make electrical contact with the micro LED devices 400 and tie line 144, as described with regard to FIG. 9. In some embodiments the micro LED devices 400 and one or more conductive lines (e.g. tie line 144 or via contact 145) protrude above a top surface 211 of the passivation layer 210 prior to and after etching. In such embodiments, etching may be used to ensure any passivation layer residues are removed from a top surface of the micro LED devices and one or more conductive lines. In other embodiments etching reduces the thickness of the passivation layer 210 so that the micro LED devices and one or more conductive lines protrude above a top surface 211 of the passivation layer after etching.

It is to be appreciated that the embodiments illustrated in FIGS. 5A-5C illustrate embodiments including a pair of micro LED devices 400 bonded within the reflective bank structure of FIG. 1B, which includes a dam structure 147 including dam layer 127 and tie line 144. In the embodiments illustrated in FIGS. 5A-5C, the tie line 144 corresponds to a conductive line atop the bank layer 126. Embodiments of the invention are not limited to this particular configuration. For example, a single micro LED device can be bonded within the reflective bank structure, or a repair micro LED device can be bonded within the reflective bank structure. Alternative dam structures 147 can also be used, such as those described with regard to FIGS. 1C-1D. Accordingly, the tie lines 144 or via contacts 145 of the dam structures 147 can be conductive lines atop the bank layer that protrude above the passivation layer 210 and are elevated above the reflective bank structure 142 as described herein.

In accordance with embodiments of the invention, the passivation layer 210 may be transparent or semi-transparent to the visible wavelength so as to not significantly degrade light extraction efficiency of the completed system. Passivation layer may be formed of a variety of materials such as, but not limited to epoxy, acrylic (polyacrylate) such as poly(methyl methacrylate) (PMMA), benzocyclobutene (BCB), polyimide, and polyester. In some embodiments, the passivation layer is thermoset material curable using techniques such as thermal cure, UV cure, or atmospheric e-beam curing.

As previously described, the structures illustrated in FIGS. 5A-5C can be formed in different sequences. In one embodiment, the passivation layer is applied and leveled after transferring the micro LED devices. In another embodiment, the passivation layer is applied and leveled prior to transferring the micro LED devices. Punch-through may be accomplished by physically driving the micro LED device 400 through the passivation layer 210 with the transfer head 302 until contacting the reflective bank structure 142 or optional bonding layer 140 on the receiving substrate 102. As illustrated, the micro LED device 400 may be punched-through the passivation layer 210 so that passivation layer 210 laterally surrounds the quantum well layer 416. The passivation layer 210 may also be thinner than the height of the micro LED device 400 so that electrical contact can be made with the top contact 402 of the micro LED device 400.

Punch-through may also be aided by the application of heat through the transfer head 302 or receiving substrate 102. In an embodiment where the passivation layer 210 is a UV curable, atmospheric e-beam curable, or thermally curable B-staged thermoset, the application of heat can melt or soften the B-staged thermoset passivation layer 210 to aid in the punch-through. Thus, the amount of applied pressure, heat, and amount of cross-linking in the B-staged thermoset can be controlled to achieve punch-though. Application of UV energy or atmospheric e-beam after punch-through can then be used to cure the thermoset passivation layer 210 where the thermoset passivation layer 210 is UV curable or atmospheric e-beam curable. In an embodiment where the passivation layer 210 is a thermally curable B-staged thermoset, continued application of heat after punch-through can then be used to cure the thermoset passivation layer 210. In an embodiment, where the passivation layer 210 is a thermoplastic material the thermoplastic passivation layer 210 is heated above the Tg, and more specifically, above the Tg and below the Tm of the thermoplastic material during punch-through. Thus, the amount of pressure and heat applied to the thermoplastic material can be controlled to achieve punch-though.

In certain embodiments, the application of heat during punch-through can also result in reflowing of one or both of the optional bonding layers 410, 140 or diffusion between layers to assist with bonding. In addition, reflowing of any of the bonding layers 410, 140 can result in forming a new bonding layer with a higher melting temperature. In one embodiment, the application of heat not only aids with punch-through of layer 210, the application of heat also causes at least partial reflow and solidification of the bonding layers(s) 410, 140. For example, the application of heat can lead to the formation of an alloy having a higher Tm than that of the reflowed or diffused layer(s).

In an embodiment, the punch-through and release of the micro devices on the receiving substrate is performed in ten seconds or less, or more particularly one second or less. Where heat is applied, it is possible to rapidly reflow either of the optional bonding layer(s) 410, 140 to assist in bonding and to soften or initially melt the passivation layer 210, which can be a thermal, atmospheric e-beam, or UV curable B-staged thermoset, or a thermoplastic. Following the release of the array of micro devices from the array of transfer heads, the passivation layer 210 is hardened to secure the array of micro devices within the reflective bank structures. Where the passivation layer 210 is a thermoplastic, hardening is effected by allowing the thermoplastic material to cool. Where the passivation layer 210 is a B-staged thermoset, the passivation layer can be final cured through the application of UV energy, atmospheric e-beam, or heat for an order of minutes or hours to effect curing. In an embodiment, heat can be applied from below the receiving substrate 102 with heater and/or heat distribution plate. Heat can also be applied from above the receiving substrate 102. UV energy can also be applied from above or below the receiving substrate. In an embodiment, the receiving substrate is transferred to a curing chamber to effect curing following the release of the array of micro LED devices.

Figure 6A:
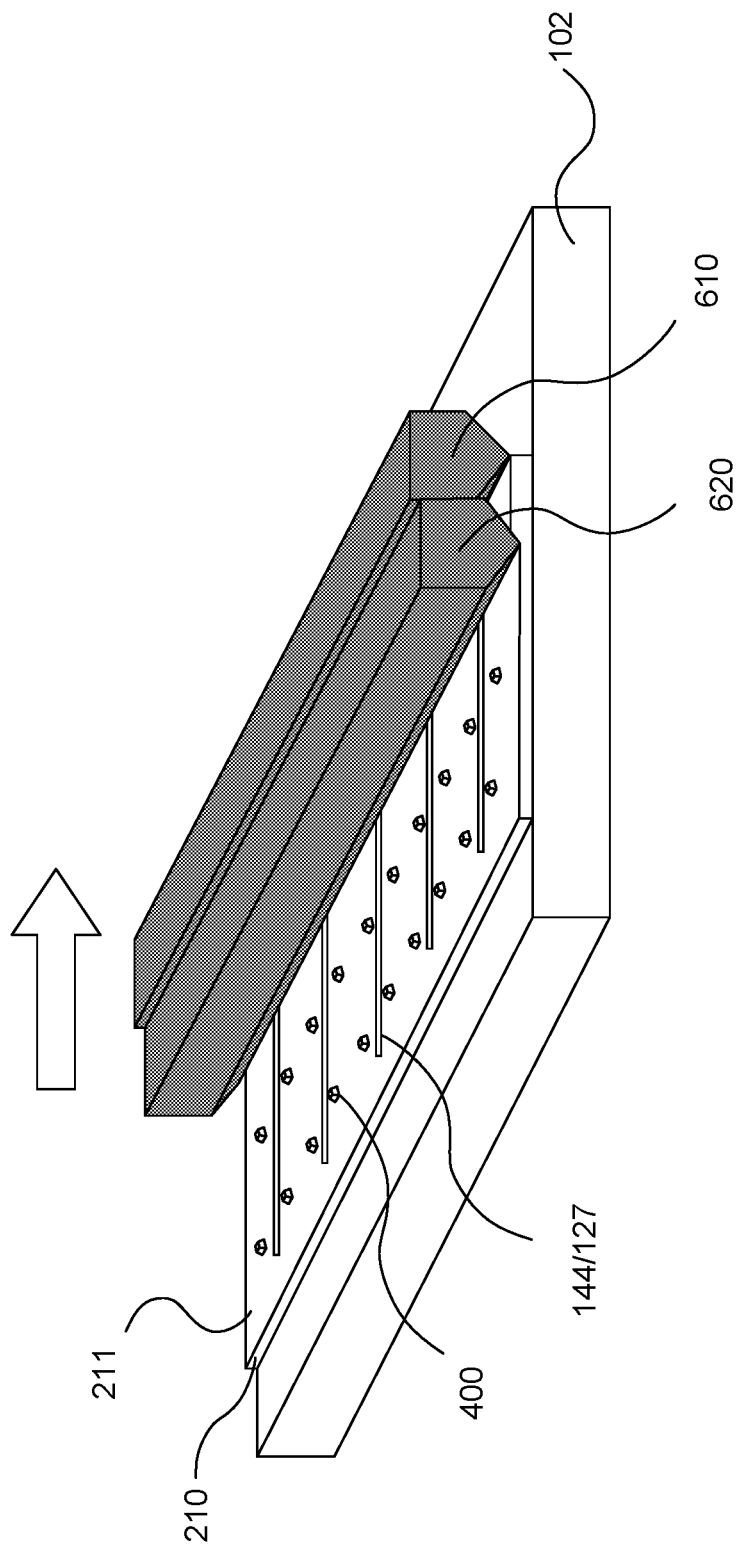
FIG. 6A is a schematic illustration of the application and leveling of a passivation layer so that a portion of the micro LED devices and conductive line atop a bank layer protrude above a top surface of the passivation layer in accordance with an embodiment of the invention.
Figure 6B:
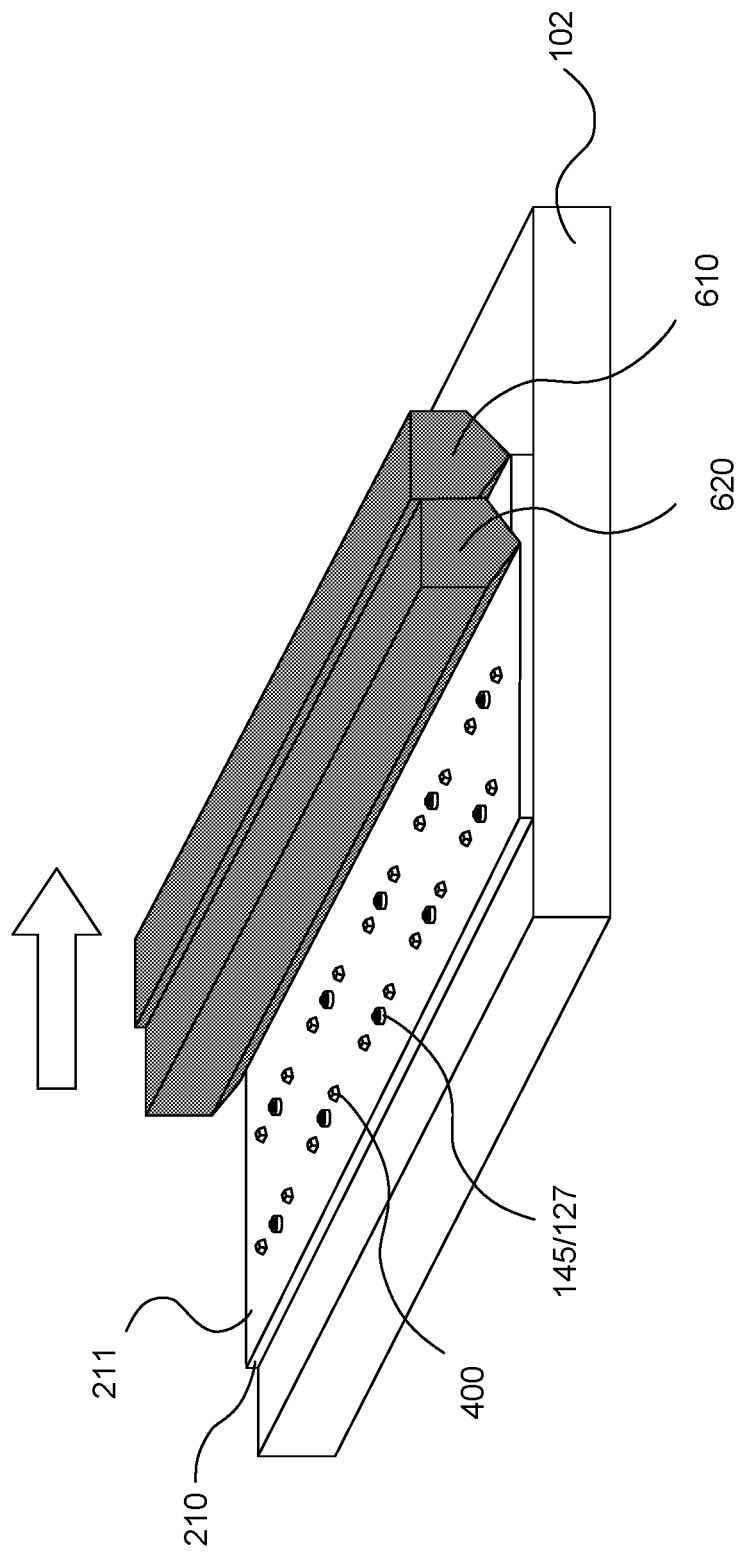
FIG. 6B is a schematic illustration of the application and leveling of a passivation layer so that a portion of the micro LED devices and conductive line atop a bank layer protrude above a top surface of the passivation layer in accordance with an embodiment of the invention.
Figure 6C:
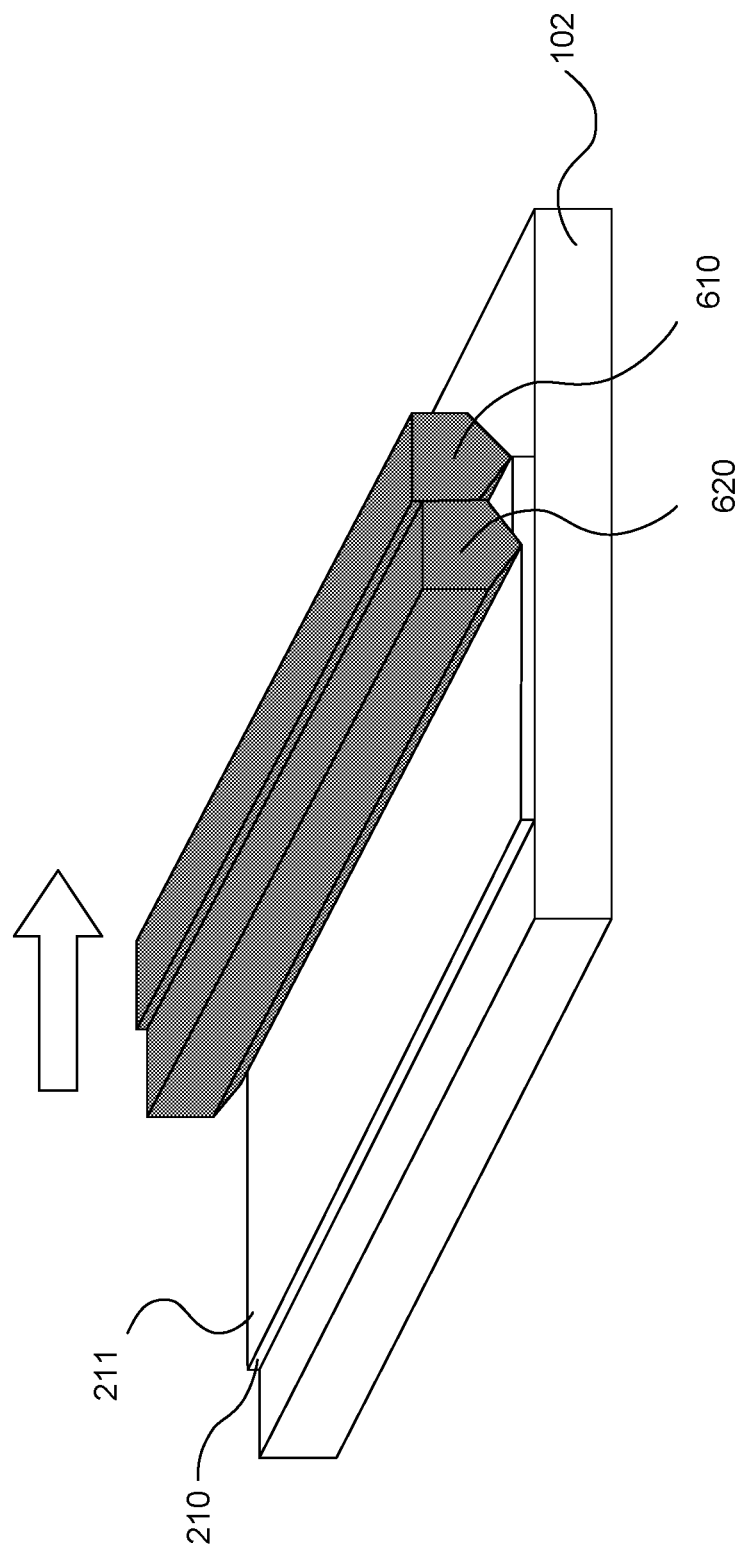
FIG. 6C is a schematic illustration of the application and leveling of a passivation layer above the micro LED devices and conductive line atop a bank layer in accordance with an embodiment of the invention.

Referring now to FIGS. 6A-6C, embodiments are illustrated in which a passivation layer 210 is applied to the substrate 102 with an applicator 610 followed by being leveled with a leveler 620 to provide a substantially flat top surface 211 of the passivation layer across the entire area that the passivation layer covers. For example, referring back to FIG. 3F, in an embodiment the passivation layer 210 can be formed over all of the subpixels 108 in the pixel area 104. In an embodiment, the passivation layer covers all of the subpixels 108 in the pixel area and the ground tie lines 144. In an embodiment, the passivation layer covers all of the subpixels 108 in the pixel area and the via contacts 145. A variety of configurations are possible, including covering the ground ring 116. In an embodiment, as the applicator 610 and leveler 620 are drawn over the substrate 102 the leveler 620 is used to form a flat top surface 211 of the passivation layer 210 above which a portion of the micro LED devices 400 and electrical lines protrude, illustrated as ground lines 144 in FIG. 6A, and via lines 145 in FIG. 6B. In other embodiments, the leveler forms a flat top surface 211 of the passivation layer 210 above the micro LED devices 400 and electrical lines, so that the micro LED devices 400 and electrical lines do not protrude above the top surface of the passivation layer, as illustrated in FIG. 6C. In such an embodiment, the passivation layer may be subsequently etched back to expose the micro LED devices and electrical lines.

The applicator 610 may assume alternative configurations based on alternative coating methods. For example, the applicator 610 may be a roller for a roller coating application. The applicator may be a nozzle for a slit coating application. Depending upon the size of the substrate 102, roller application or slit coating may be useful for applying wide line widths possible of covering the entire pixel area in a single application. Other application methods are also envisioned including spin coating, spray coating, screen printing, and ink jet printing. The leveler 620 may also assume alternative configurations based on alternative coating methods. For example, the leveler 620 may be a roller, squeegee, or blade.

FIGS. 7A-7B are side-view illustrations of etching passivation layer residues from the micro LED devices and conductive line atop a bank layer in accordance with an embodiment of the invention. As shown in the embodiment illustrated in FIG. 7A the passivation layer 210 includes a substantially flat top surface 211. The micro LED devices 400 and conductive line illustrated as the tie line 144 protrude above the top surface 211. In the particular embodiment illustrated passivation layer 210 residues 213 may at least partially cover the top surfaces of the micro LED devices 400 and/or conductive line illustrates as tie line 144. In the embodiment illustrated in FIG. 7B, a plasma etching process, e.g. $O_2$, Ar, or $CF_4$ plasma etch, can be used after forming the passivation layer 210 to remove the residues 213 ensuring the top surface of the micro LED devices 400, such as top conductive contacts 402, and the tie line 144 of the dam structure 147 are exposed to enable the top conductive electrode layers 318 to make electrical contact with the micro LED devices 400 and tie line 144, as described with regard to FIG. 9.

FIGS. 8A-8B are side-view illustrations of etching a passivation layer so that a portion of the micro LED devices and a conductive line atop a bank layer protrude above a top surface of the passivation layer in accordance with an embodiment of the invention. As shown in the embodiment illustrated in FIG. 8A the passivation layer 210 includes a substantially flat top surface 211 that is above the micro LED devices 400 and/or the conductive line illustrated as tie line 144. In an embodiment, the top surface of the conductive line illustrated as tie line 144 is used to set the elevation of the top surface 211 of the passivation layer 210 during application and leveling of the passivation layer. In the embodiment illustrated in FIG. 8B, a plasma etching process, e.g. $O_2$, Ar, or $CF_4$ plasma etch, can be used to thin the passivation layer 210 so that the top surface of the micro LED devices 400, such as top conductive contacts 402, and the tie line 144 of the dam structure 147 are exposed and protrude above the top surface 211 of the passivation layer 210.

Figure 9:
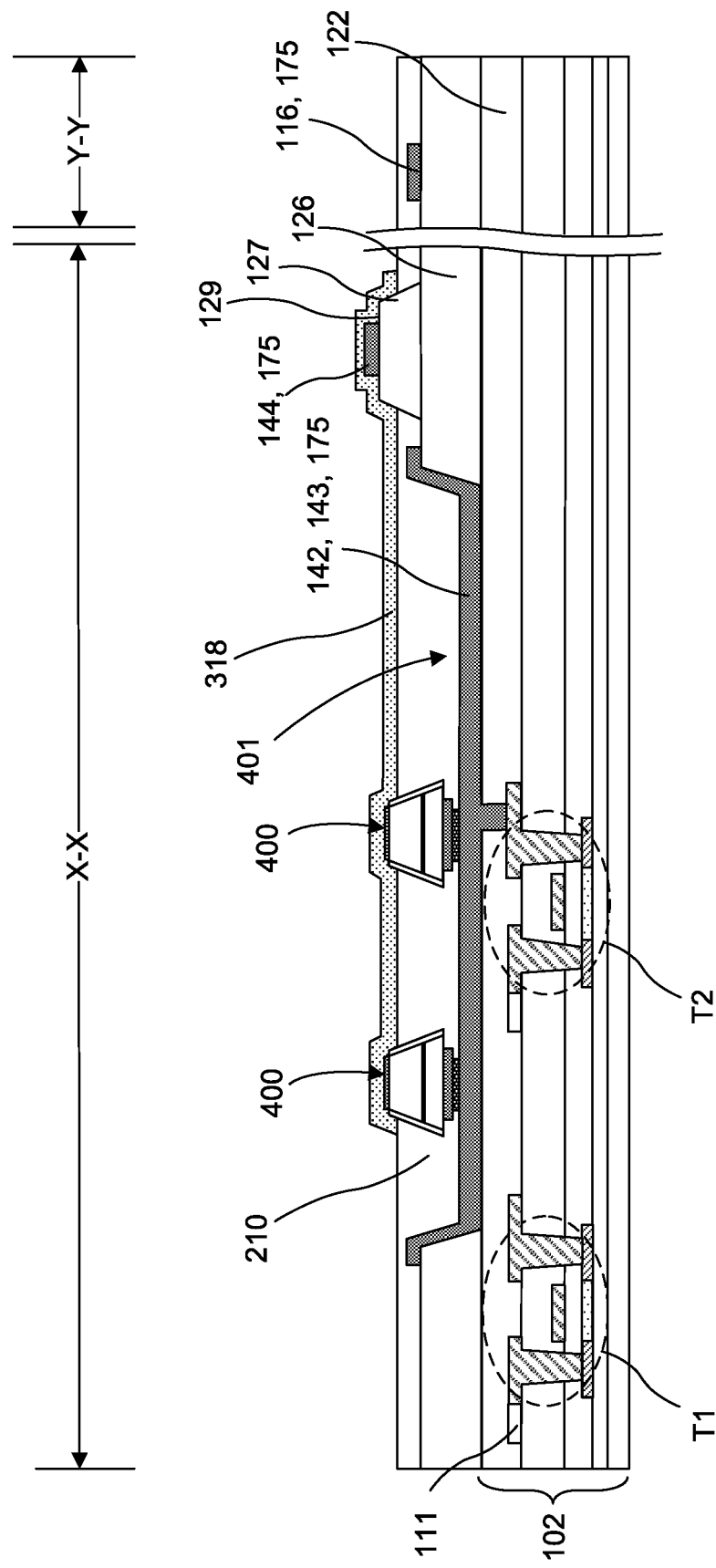
FIG. 9 is a side-view illustration of the active matrix display panel of FIG. 3F taken along lines X-X and Y-Y after the formation of a top electrode layer in accordance with an embodiment of the invention.

Referring now to FIG. 9, in embodiments including vertical micro LED device pairs, following the formation, curing, and etching of passivation layer 210, a top electrode layer 318 is formed on the micro LED device 400 pairs and in electrical contact with the conductive lines (e.g. 144, 145) and ground ring 116. Depending upon the particular application, top electrode layer 318 may be opaque, reflective, transparent, or semi-transparent to the visible wavelength. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylenedioxythiophene) (PEDOT), polyaniline, polyacetylene, polypyrrole, and polythiophene. In an embodiment top electrode layer 318 is approximately 50 nm-1 μm thick ITO-silver-ITO stack, with the silver layer thin enough to be transparent to the visible wavelength spectrum. In a particular embodiment, the top electrode layer 318 is formed by ink jet printing. In an embodiment top electrode layer 318 is approximately 50 nm-1 μm thick PEDOT. Other methods of formation may include chemical vapor deposition (CVD), physical vapor deposition (PVD), spray coating, or spin coating depending upon the desired area to be coated and any thermal constraints.

In accordance with embodiments of the present invention, one or more top electrode layers 318 may be used to electrically connect the micro LED device 400 pairs from the array of subpixels to ground line 144. A variety of configurations are possible with different redundancy and repair configurations. In interest of clarity, FIG. 9 is limited to an exemplary top electrode layer 318 configuration within a single subpixel, while a more detailed description is provided with regard to FIGS. 11-13 for the pixel arrangement in on a display substrate.

Figure 10:
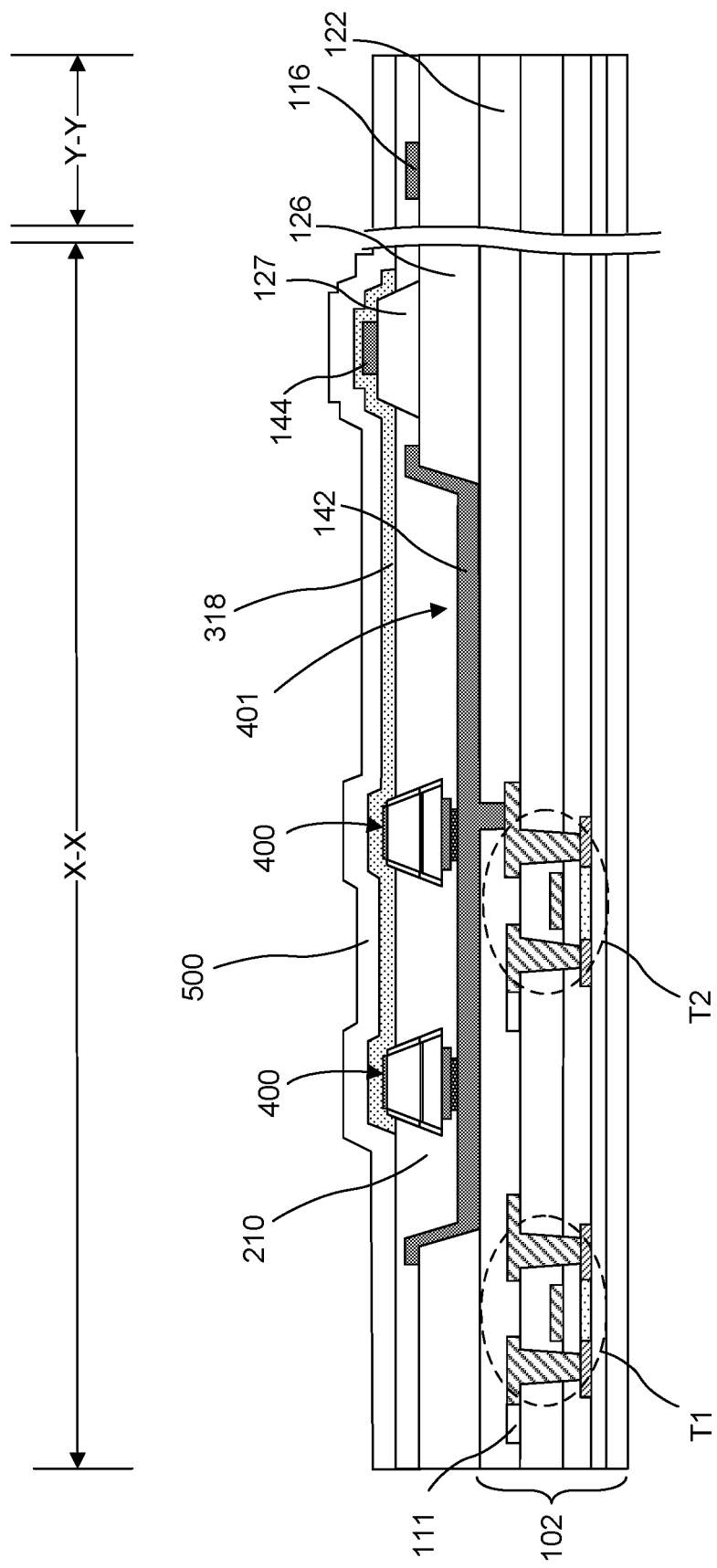
FIG. 10 is a side-view illustration of the active matrix display panel of FIG. 3F taken along lines X-X and Y-Y after the formation of a cover layer in accordance with an embodiment of the invention.

In the embodiment illustrated in FIG. 9, a single top electrode layer 318 is illustrated as connecting both micro LED devices 400 of the pair to tie line 144. For example, such a configuration may be used when both micro LED devices 400 have been determined to be transferred to the display substrate and not be defective or contaminated. Following the formation of the top electrode a cover 500 can be formed over the exemplary structure. In the exemplary embodiment illustrated in FIG. 10, cover layer is conformal to the topography of the micro LED devices 400 and overall structure over substrate 102. Cover layer 500 may function to provide both chemical passivation and physical protection to the underlying structure. Cover layer 500 may also be flexible, and may be transparent. Cover layer 500 may be formed of a variety of materials such as, but not limited to, silicon oxide (SiO$_2$), silicon nitride (SiN$_x$), poly(methyl methacrylate) (PMMA), benzocyclobutene (BCB), polyimide, and polyester.

Figure 11:
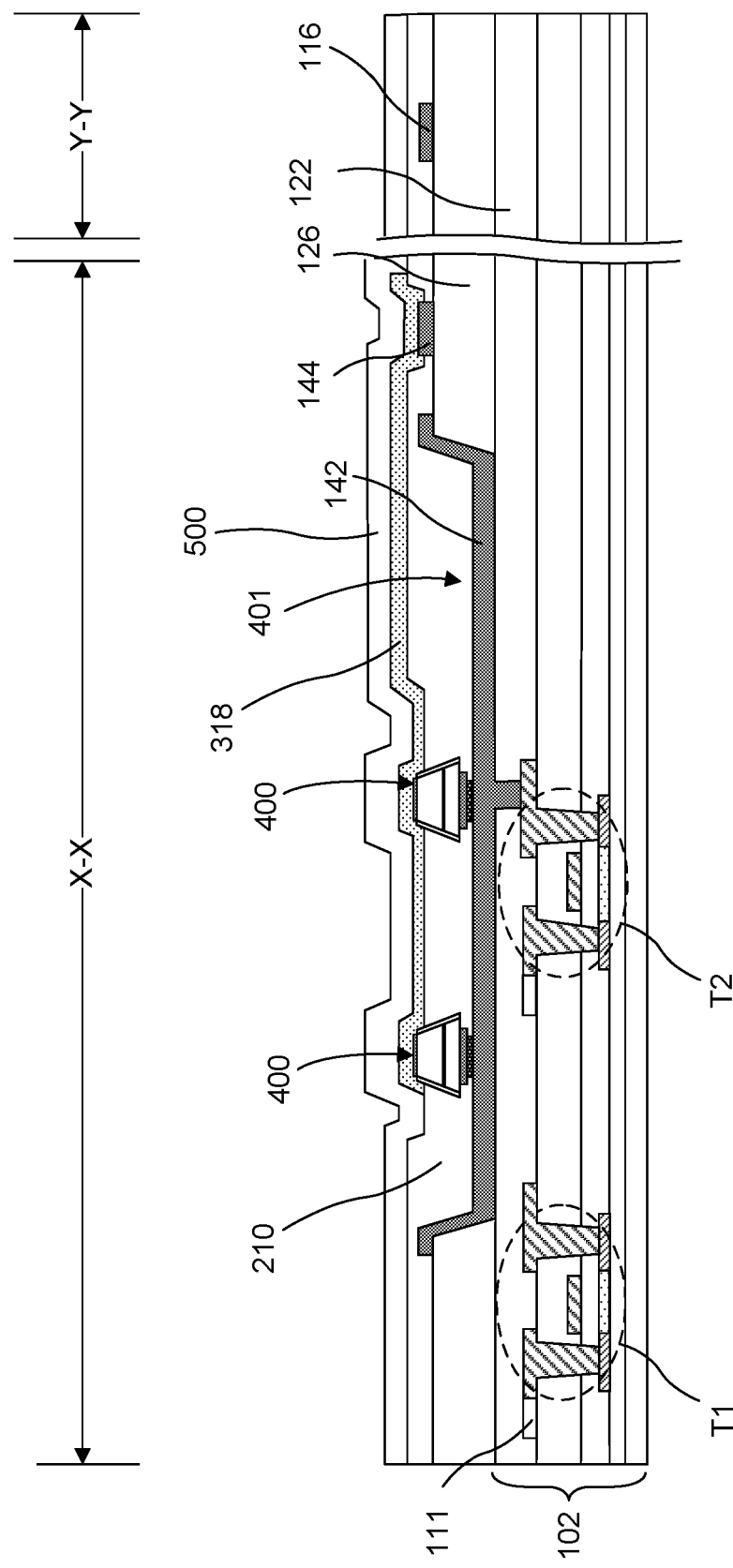
FIG. 11 is a side-view illustration of the active matrix display panel of FIG. 3F taken along lines X-X and Y-Y without a dam structure in accordance with an embodiment of the invention.

FIG. 11 illustrates an alternative embodiment in which a dam structure has not been formed. In the embodiment illustrated in FIG. 11, a passivation layer 210 can be formed similarly as described above, and may be leveled. Following formation of the passivation layer 210, portions of the passivation layer can be etched, for example, using lithographic techniques to expose the micro LED devices 400 and conductive lines (e.g. 144, 145), followed by formation of top electrode 318 and cover 500. In such an embodiment etching may be a timed etch so as to not expose the quantum well structures within the micro LED devices.

Figure 12A:
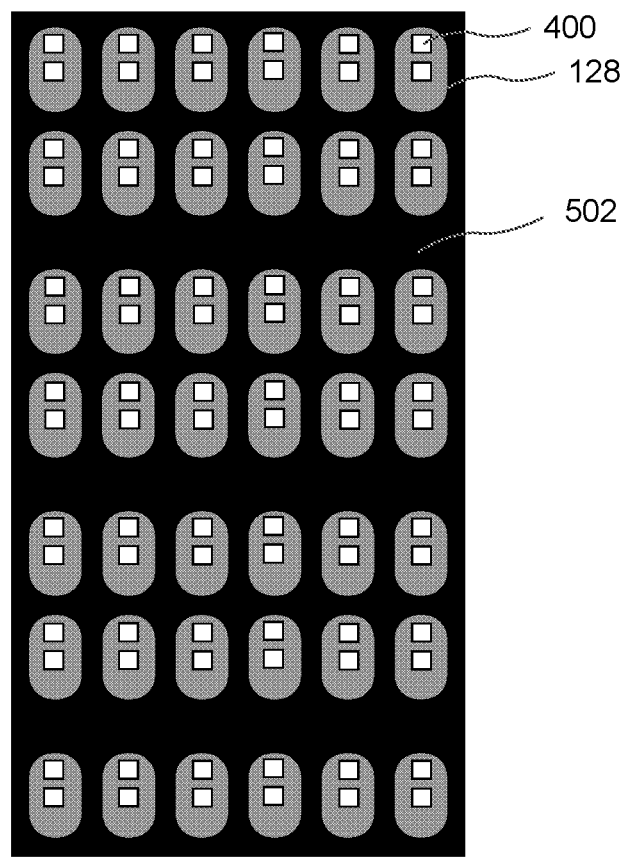
FIG. 12A is a top view illustration of the active matrix display panel of FIG. 3F taken along lines X-X and Y-Y after the formation of a black matrix material between subpixels in accordance with an embodiment of the invention.

FIG. 12A is a top view illustration of the active matrix display panel in which a black matrix material 502 is formed between subpixels in accordance with an embodiment of the invention. In an embodiment, the black matrix 502 is formed prior to applying the cover 500. Black matrix 502 can be formed from a method that is appropriate based upon the material used. For example, black matrix 502 can be applied using ink jet printing, sputter and etching, spin coating with lift-off, or a printing method. Exemplary black matrix materials include carbon, metal films (e.g. nickel, aluminum, molybdenum, and alloys thereof), metal oxide films (e.g. chromium oxide), and metal nitride films (e.g. chromium nitride), organic resins, glass pastes, and resins or pastes including a black pigment or silver particles.

Figure 12B:
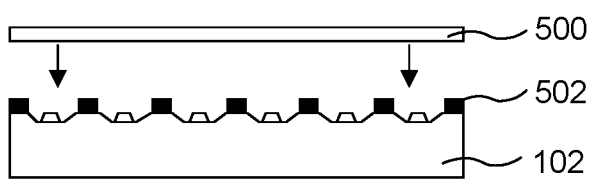
FIG. 12B is a schematic side view illustration of the application of a black matrix material before forming a cover plate over the display panel substrate in accordance with an embodiment of the invention.
Figure 12C:
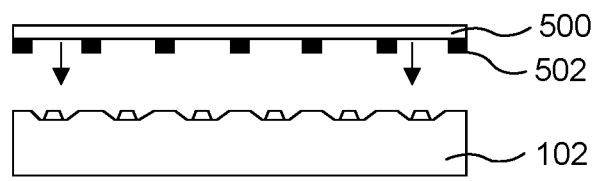
FIG. 12C is a schematic side view illustration of the application of a black matrix material with a cover plate over the display panel substrate in accordance with an embodiment of the invention.

In addition to being a conformal layer, cover 500 can be a separate cover plate that may be attached to the substrate by an adhesive, for example. FIG. 12B is a schematic side view illustration of the application of a black matrix material before forming a cover plate over the display panel substrate in accordance with an embodiment of the invention. FIG. 12C is a schematic side view illustration of the application of a black matrix material with a cover plate over the display panel substrate in accordance with an embodiment of the invention.

Figure 13A:
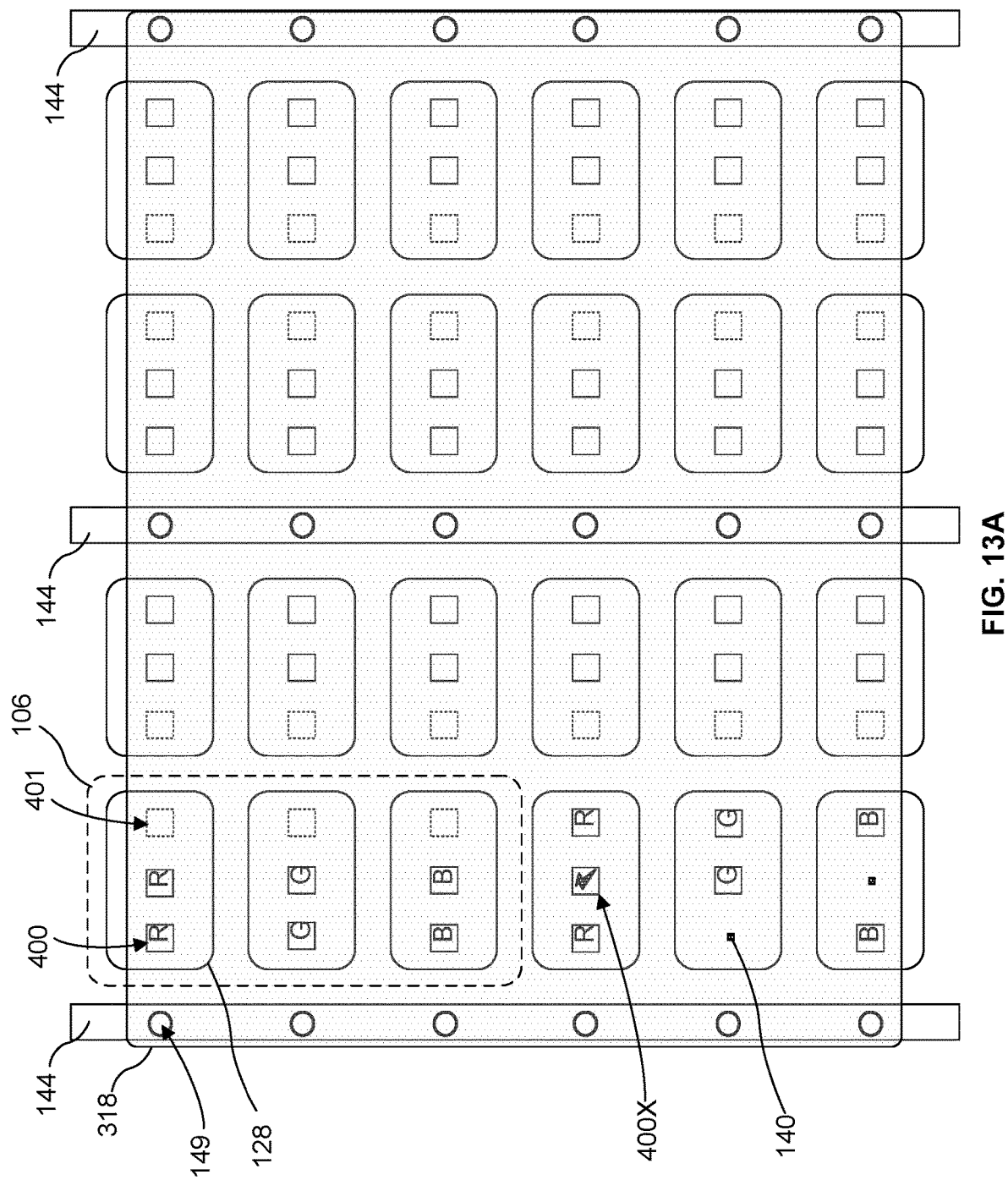
FIG. 13A is a top schematic view illustration of a top electrode layer formed over an array of micro LED devices including a variety of configurations in accordance with an embodiment of the invention.

FIG. 13A is a top schematic view illustration of an array of micro LED devices including a variety of redundancy and repair configurations described in accordance with embodiments of the invention. In the particular embodiments illustrated in FIG. 13A, a top electrode layer 318 is formed over a plurality of bank openings 128, and may be formed over a plurality of subpixels or pixels 106. In an embodiment, the top electrode layer 318 is formed over all of the micro LED devices 400 in the pixel area. FIG. 13A illustrates various possible configurations. One configuration in the labeled pixels 106 includes those in which the repair micro LED sites 401 are open, and repair micro LED devices have not been transferred. FIG. 13A also illustrates configurations in which repair micro LED devices 400 have been transferred when defective or contaminated micro LED devices 400X are detected, or missing micro LED devices are detected, evidenced by bonding layers 140 at a micro LED device bonding site.

Figure 13B:
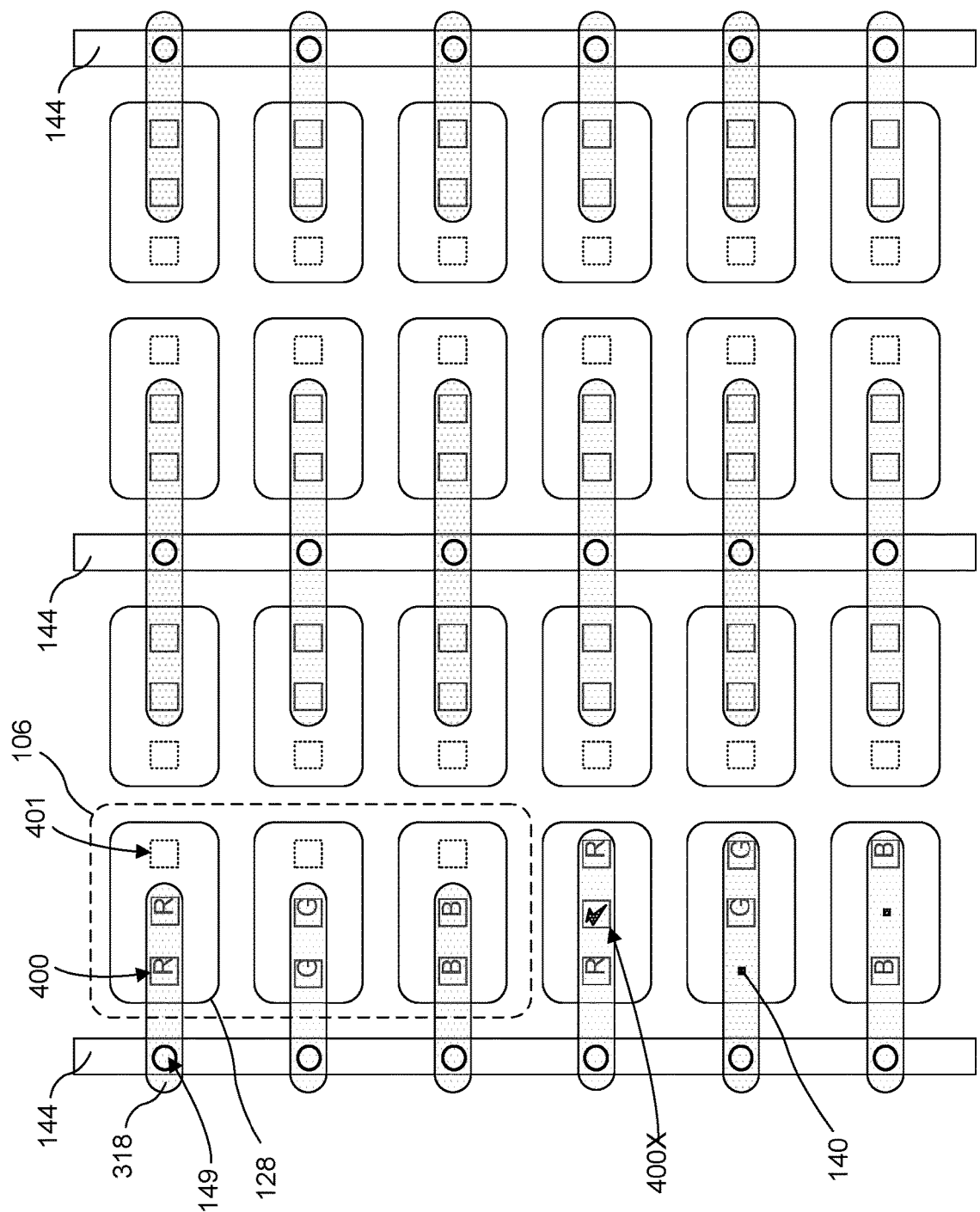
FIG. 13B is a top schematic view illustration of a plurality of separate top electrode layers formed over an array of micro LED devices including a variety of configurations in accordance with an embodiment of the invention.

FIG. 13B is a top schematic view illustration of a plurality of separate top electrode layers 318 formed over an array of micro LED devices including a variety of configurations in accordance with an embodiment of the invention. The embodiments illustrated in FIG. 13B differ from those illustrated in FIG. 13A particularly in formation of a plurality of separate top electrode layers 318. In one embodiment, such as those illustrated in the labeled pixel 106 where a micro LED device 400 is not placed on the repair bonding site 401, it is not required for the top electrode layers 318 to be formed thereon. Accordingly, the length of the top electrode layer 318 can be determined based upon whether or not a replacement micro LED device is added. The top electrode layer 318 may also be formed over the bonding site 401.

In some embodiments, the top electrode layers 318 are formed by ink jet printing or screen printing. Ink jet printing in particular may be suitable since it is a non-contact printing method. Conventional AMOLED backplane processing sequences typically blanket deposit the top electrode layer in a deposition chamber followed by singulation of the individual backplanes from a larger substrate. In accordance with embodiments of the invention, a display substrate 102 can be singulated from a larger substrate prior to transferring the array of micro LED devices. In an embodiment ink jet printing or screen printing provides a practical approach for patterning the individual top electrode layers without requiring a separate mask layer for each particular configuration in the redundancy and repair scheme. Line width can also vary for the top electrode layers 318 depending upon application. For example, the line width may approach that of the subpixel area. Alternatively, the line width may be minimal. For example, line widths as low as approximately 15 microns may be accomplished with commercially available ink jet printers, and line widths as low as approximately 30 microns may be accomplished with commercially available screen printers. Accordingly, the line width may be more or less than the maximum width of the micro LED devices.

Figure 13C:
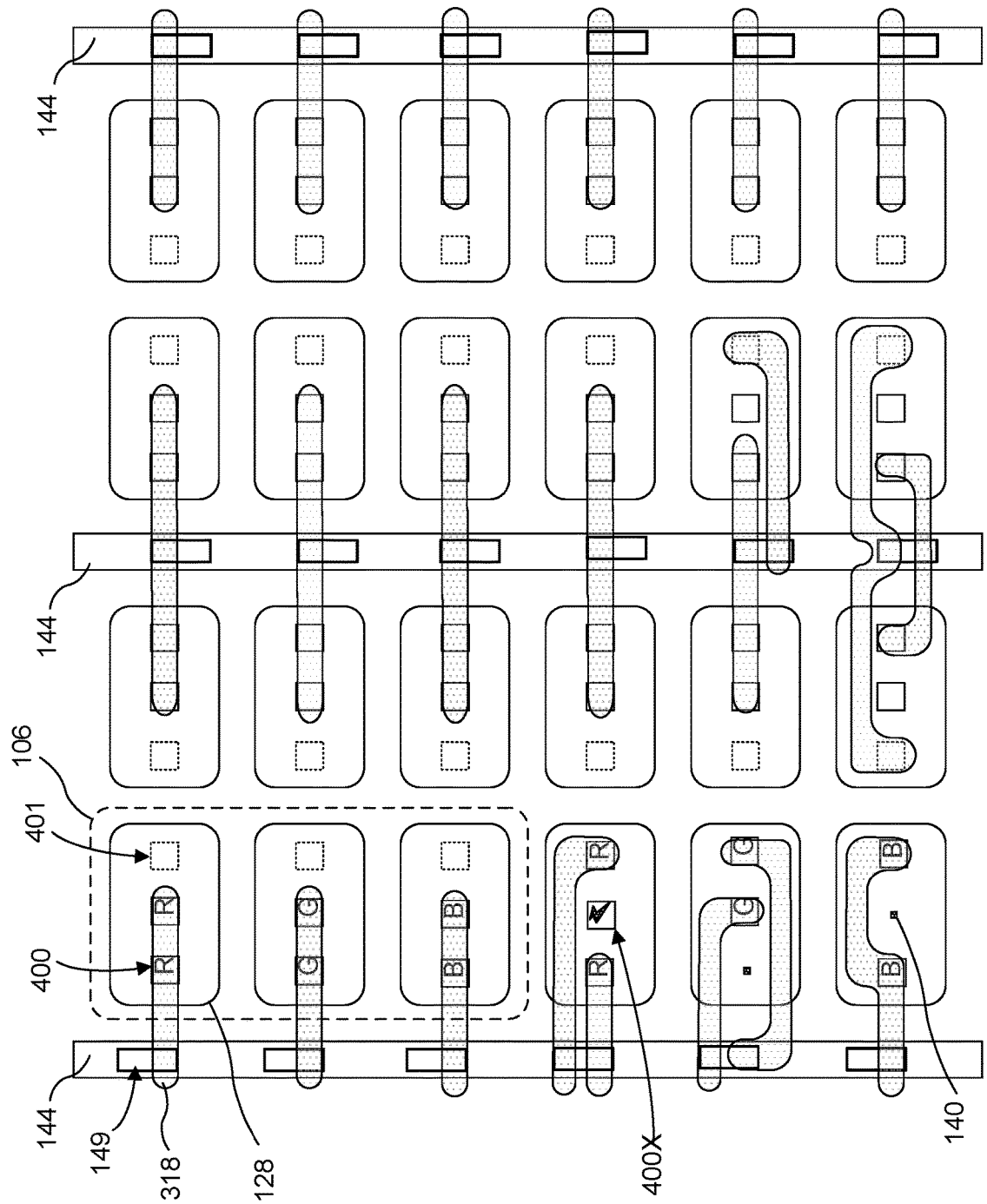
FIG. 13C is a top schematic view illustration of a plurality of separate top electrode layers formed over an array of micro LED devices including a variety of configurations in accordance with an embodiment of the invention.

FIG. 13C is a top schematic view illustration of a plurality of separate top electrode layers formed over an array of micro LED devices including a variety of configurations in accordance with an embodiment of the invention. In the particular embodiments illustrated in FIG. 13C, the arrangements of micro LED devices 400 are the same as those described above with regard to FIGS. 13A-13B. The embodiments illustrated in FIG. 13C differ from those illustrated in FIG. 13B particularly in formation of the top electrode layers 318. The embodiments illustrated in FIG. 13B were shown as altering the length of the top electrode layers 318, while the embodiments illustrated in FIG. 13C are shown as altering the path of the top electrode layers 318, and/or number of top electrode layers 318.

Figure 14:
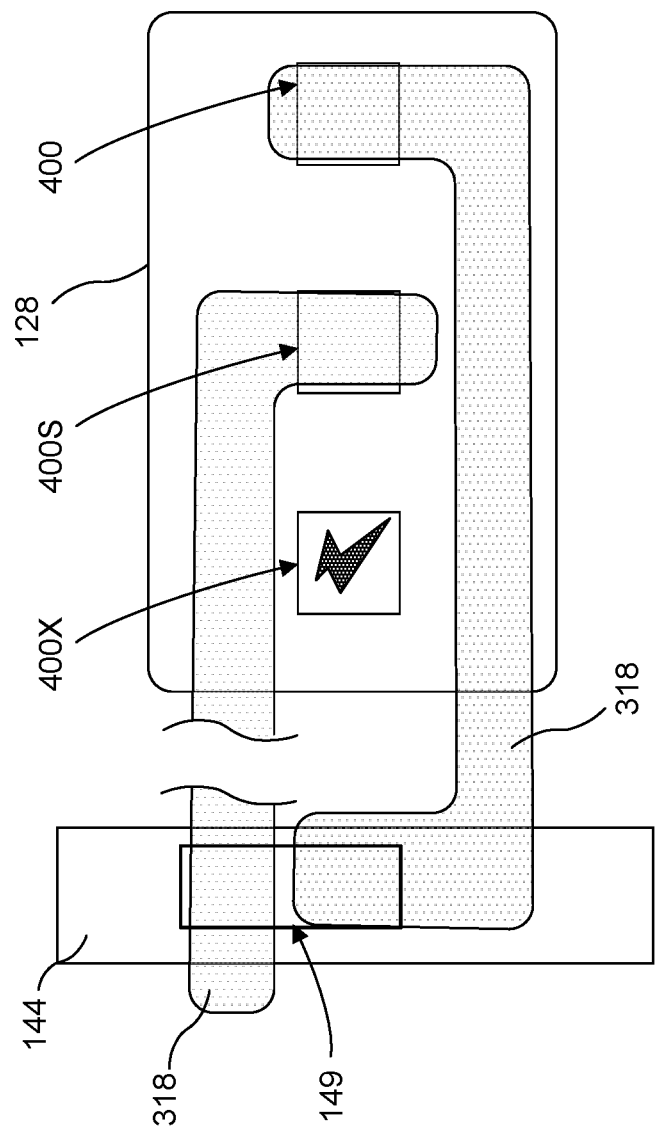
FIG. 14 is a top schematic view illustration of a scribed top electrode layer in accordance with an embodiment of the invention.

The formation of separate top electrode layer(s) 318 may provide an additional benefit during electrical testing of the display substrate 102 after formation of the top electrode layer(s) 318. For example, prior to formation of the top electrode layer 318 it may not have been possible to detect certain defects resulting in shorting of a micro LED device 400S. The implication of a shorted micro LED device 400S could result in a dark subpixel in which all of the current flows through the shorted micro LED devices 400S rather than any of the other micro LED devices in the subpixel. In the embodiment illustrated in FIG. 14 the top electrode layer 318 connected to a shorted micro LED device 400S is cut using a suitable technique such as laser scribing. In this manner, electrical shorts that could not have been or were not detected during the integrated testing method previously described could potentially be detected during an electrical test with the application of electrical current through the display after formation of the top electrode layer 318. In such an embodiment, if a micro LED device 400S is shorted, the top electrode layer 318 connected to the micro LED device 400S can be cut, allowing the redundant and/or repair micro LED device to provide the emission from the subpixel.

Figure 15:
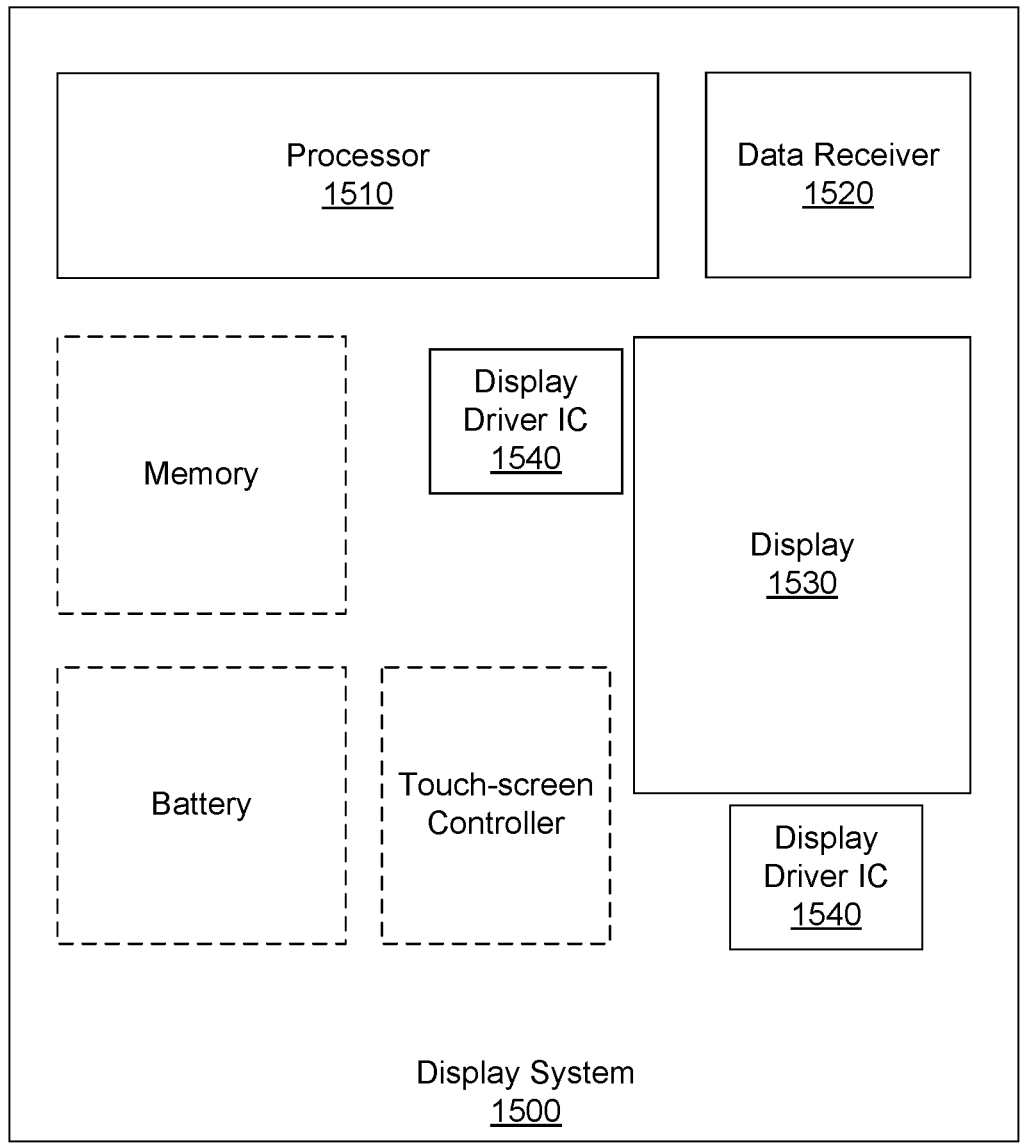
FIG. 15 is a schematic illustration of a display system in accordance with an embodiment of the invention.

FIG. 15 illustrates a display system 1500 in accordance with an embodiment. The display system houses a processor 1510, data receiver 1520, a display 1530, and one or more display driver ICs 1540, which may be scan driver ICs and data driver ICs. The data receiver 1520 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 1540 may be physically and electrically coupled to the display 1530.

In some embodiments, the display 1530 includes one or more micro LED devices 400 that are formed in accordance with embodiments of the invention described above. For example, the display 1530 may include a plurality of micro LED devices, dam structure, and passivation layer as described above.

Depending on its applications, the display system 1500 may include other components. These other components include, but are not limited to, memory, a touch-screen controller, and a battery. In various implementations, the display system 1500 may be a television, tablet, phone, laptop, computer monitor, kiosk, digital camera, handheld game console, media display, ebook display, or large area signage display.

Figure 16:
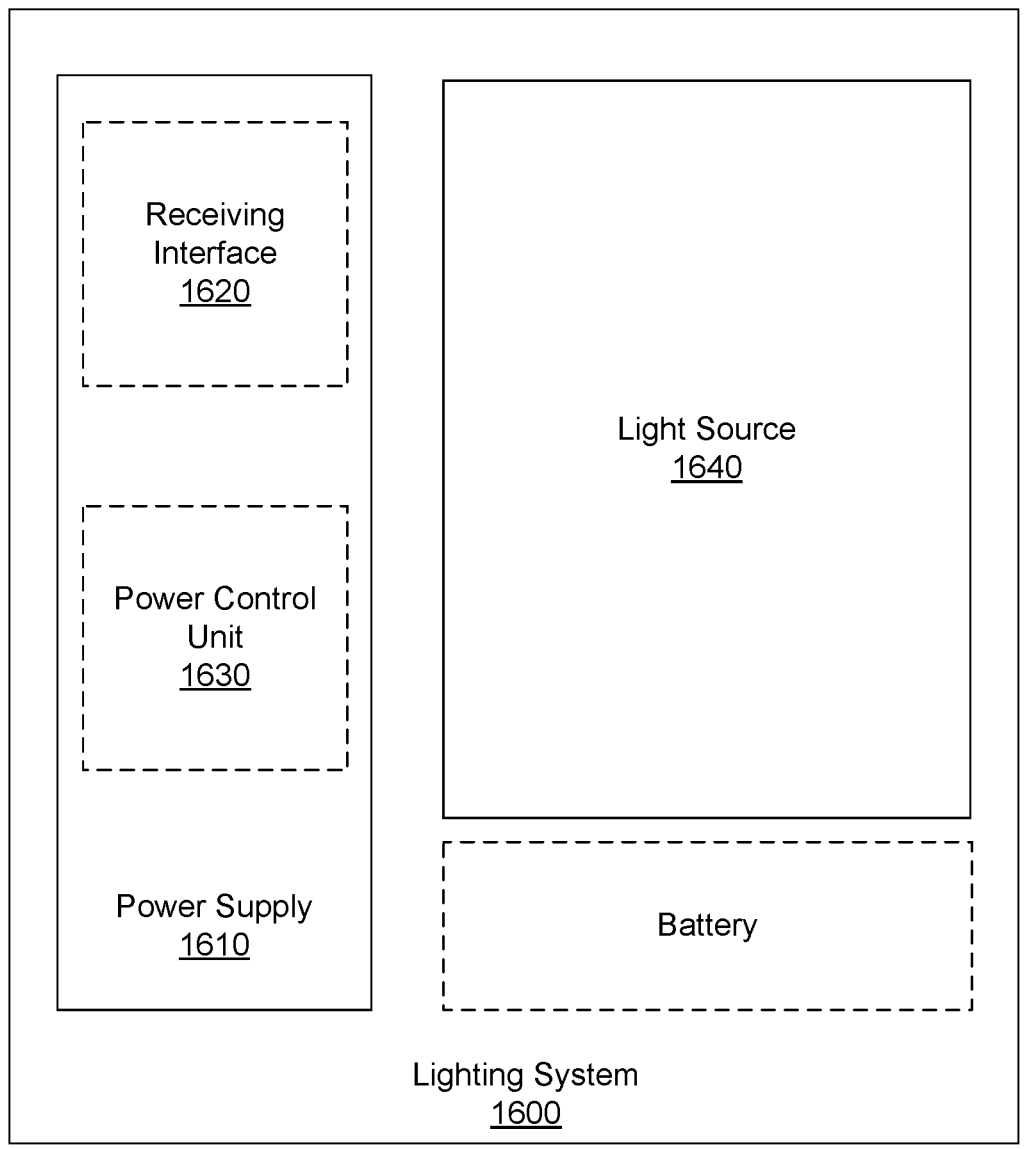
FIG. 16 is a schematic illustration of a lighting system in accordance with an embodiment of the invention.

FIG. 16 illustrates a lighting system 1600 in accordance with an embodiment. The lighting system houses a power supply 1610, which may include a receiving interface 1620 for receiving power, and a power control unit 1630 for controlling power to be supplied to the light source 1640. Power may be supplied from outside the lighting system 1600 or from a battery optionally included in the lighting system 1600. In some embodiments, the light source 1640 includes one or more micro LED devices 400 that are formed in accordance with embodiments of the invention described above. For example, the light source 1640 may include a plurality of micro LED devices, dam structure, and passivation layer as described above. In various implementations, the lighting system 1600 may be interior or exterior lighting applications, such as billboard lighting, building lighting, street lighting, light bulbs, and lamps.

In utilizing the various aspects of this invention, it would become apparent to one skilled in the art that combinations or variations of the above embodiments are possible for integrating a plurality of micro LED devices into a corresponding plurality of reflective bank structures of a light emitting device. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A display panel pixel structure comprising:
    a substrate including a Vss line and a planarization layer over the Vss line;
    a plurality of light emitting diode (LEDs) over the planarization layer and within a pixel area of the display panel;
    a patterned dam layer over the planarization layer;
    a patterned conductive layer on top of the patterned dam layer, wherein the patterned conductive layer is in electrical contact the Vss line; and
    a top conductive electrode layer that electrically connects the plurality of LEDs with the patterned conductive layer.

2. The display panel of claim 1, further comprising a passivation layer over the substrate and laterally around the plurality of LEDs, wherein the top conductive electrode layer is over the passivation layer.

3. The display panel of claim 2, wherein the passivation layer comprises a thermoset material.

4. The display panel of claim 3, wherein the thermoset material is an acrylic.

5. The display panel of claim 2, wherein each LED comprises a vertical p-n diode between a bottom contact and a top contact.

6. The display panel of claim 5, wherein the substrate comprises a plurality of bottom electrodes, and each LED is bonded to a corresponding bottom electrode.

7. The display panel of claim 6, wherein each LED is bonded to a corresponding bottom electrode with a solder material.

8. The display panel of claim 6, wherein each LED has a maximum width of 1 to 100 μm.

9. The display panel of claim 6, wherein each LED has a maximum width of 1 to 20 μm.

10. The display panel of claim 6, wherein each LED has a maximum width of 1 to 10 μm.

11. The display panel of claim 6, further comprising working circuitry in the substrate and connected to the plurality of bottom electrodes.

12. The display panel of claim 6, wherein the patterned conductive layer spans along an opening of the patterned dam layer.

13. The display panel of claim 6, wherein a top surface of the passivation layer is below of top surface of each LED and a top surface of the patterned dam layer.

14. The display panel of claim 13, wherein the top surface of the passivation layer is a level surface.

15. The display panel of claim 6:
- a second Vss line, wherein the planarization layer is over the second Vss line;
- a second plurality of LEDs over the planarization layer and within the pixel area of the display panel;
- a second patterned dam layer over the planarization layer;
- a second patterned conductive layer on top of the second patterned dam layer, wherein the second patterned conductive layer is in electrical contact the second Vss line; and
- a second top conductive electrode layer that electrically connects the second plurality of LEDs with the second patterned conductive layer.

16. The display panel of claim 15, wherein the second patterned conductive layer spans along a second opening of the second patterned dam layer.

17. The display panel of claim 16, wherein a top surface of the passivation layer is below of top surface of each LED and a top surface of the patterned dam layer.

18. The display panel of claim 17, wherein the top surface of the passivation layer is a level surface.

* * * * *